US010446367B2

(12) United States Patent
Xiao

(10) Patent No.: US 10,446,367 B2
(45) Date of Patent: Oct. 15, 2019

(54) SCAN STRATEGIES TO MINIMIZE CHARGING EFFECTS AND RADIATION DAMAGE OF CHARGED PARTICLE BEAM METROLOGY SYSTEM

(71) Applicant: KLA-Tencor Corporation, Milpitas, CA (US)

(72) Inventor: Hong Xiao, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/969,158

(22) Filed: May 2, 2018

(65) Prior Publication Data

US 2019/0279841 A1 Sep. 12, 2019

Related U.S. Application Data

(60) Provisional application No. 62/639,603, filed on Mar. 7, 2018.

(51) Int. Cl.
*H01J 37/26* (2006.01)
*H01J 37/28* (2006.01)
(Continued)

(52) U.S. Cl.
CPC .............. *H01J 37/28* (2013.01); *G01B 15/00* (2013.01); *H01J 37/222* (2013.01); *G01B 2210/56* (2013.01)

(58) Field of Classification Search
CPC ........ H01J 37/28; H01J 37/222; G01B 15/00; G01B 2210/56
(Continued)

(56) References Cited

U.S. PATENT DOCUMENTS 5,502,306 A 3/1996 Meisburger et al.
2001/0006216 A1 7/2001 Koike
(Continued)

OTHER PUBLICATIONS

Hiroki Kawada, Takahiro Kawasaki, Junichi Kakuta, Masami Ikota, Tsuyoshi Kondo, "How to measure a-few-nanometer-small LER occurring in EUV lithography processed feature," Proc. SPIE 10585, Metrology, Inspection, and Process Control for Microlithography XXXII, 1058526 (Mar. 13, 2018); doi:10.1117/12.2299969.
(Continued)

*Primary Examiner* — Nicole M Ippolito
(74) *Attorney, Agent, or Firm* — Kwan & Olynick LLP

(57) ABSTRACT

Disclosed are apparatus and methods for performing overlay metrology upon a target having at least two layers formed thereon. A target having a plurality of periodic structures for measuring overlay in at least two overlay directions is provided. A charged particle beam is scanned in a first direction across a plurality of scan swaths of the target and at a first tilt with respect to the target so that each edge of the periodic structures is scanned at an angle. The charged particle beam is scanned in a second direction, which is opposite the first direction, across the plurality of scan swaths and at a second tilt that is 180° from the first tilt. The first and second direction scanning operations are then repeated for different first and second tilts and a different plurality of scan swaths of the target so that the target is scanned symmetrically. Images that are generated by the first and second direction scanning operations are combined to form a combined image, and an overlay error of the target is determined and reported based on analyzing the combined image.

20 Claims, 19 Drawing Sheets

(51) Int. Cl.
*H01J 37/22* (2006.01)
*G01B 15/00* (2006.01)

(58) Field of Classification Search
USPC .................... 250/306, 307, 309, 310, 311
See application file for complete search history.

(56) References Cited

U.S. PATENT DOCUMENTS

| | | |
|---|---|---|
| 2005/0048741 A1 | 3/2005 | Phan et al. |
| 2010/0157266 A1* | 6/2010 | Zimmermann ..... G03F 7/70333 355/53 |
| 2012/0133938 A1 | 5/2012 | Deckers et al. |
| 2014/0353498 A1* | 12/2014 | Shur ..................... H01J 37/28 250/307 |
| 2017/0047197 A1 | 2/2017 | Hotta et al. |
| 2018/0329312 A1* | 11/2018 | Kuiper ................ G03F 7/70633 |

OTHER PUBLICATIONS

PCT International Search Report PCT/US2019/020630, International Filing Date Mar. 5, 2019, dated Jun. 19, 2019. 3 pages.
PCT Written Opinion for International Application No. PCT/US2019/020630, dated Jun. 19, 2019. 6 pages.

\* cited by examiner

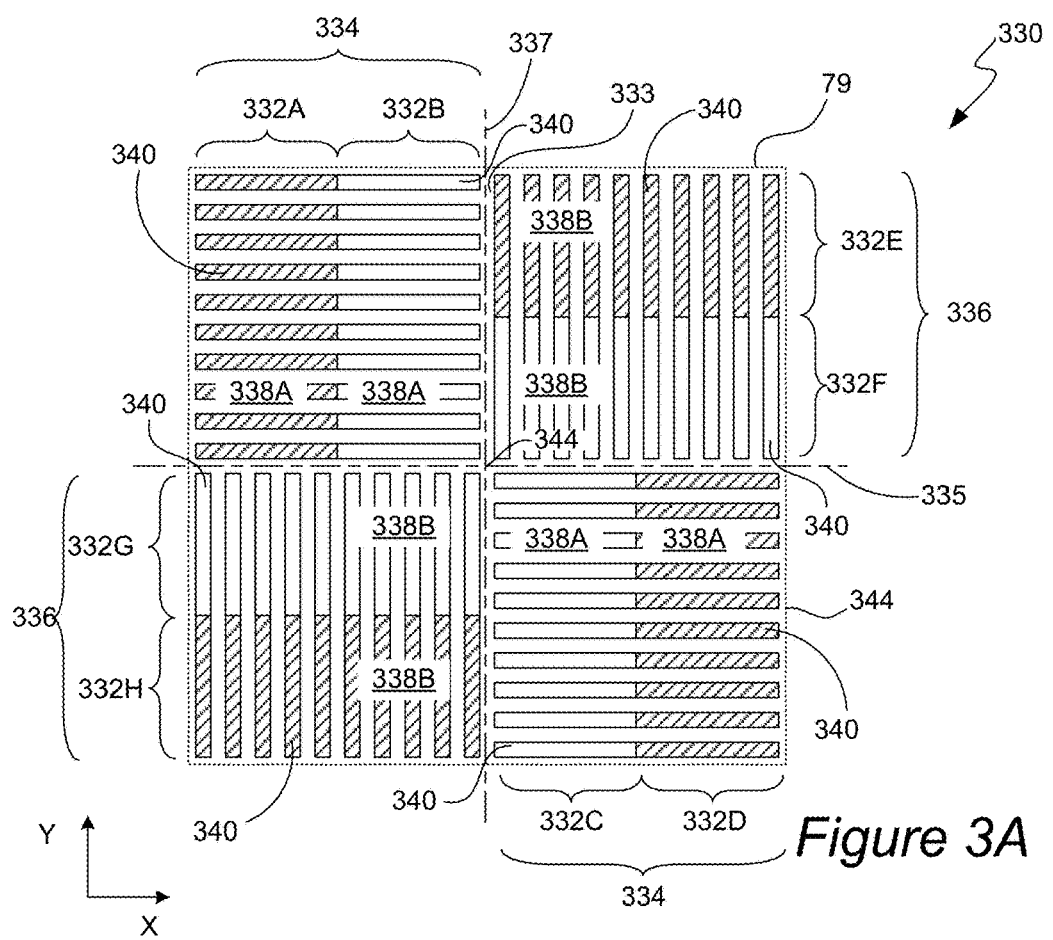
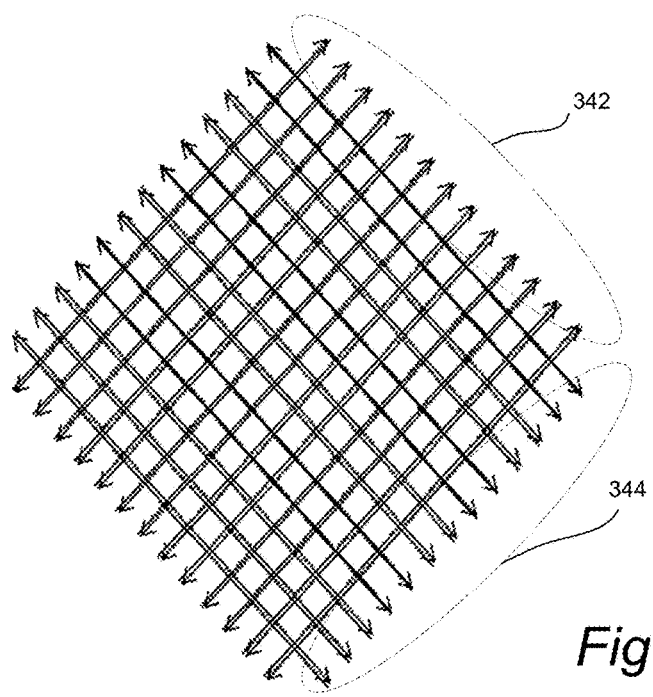
Figure 3A
Figure 3B

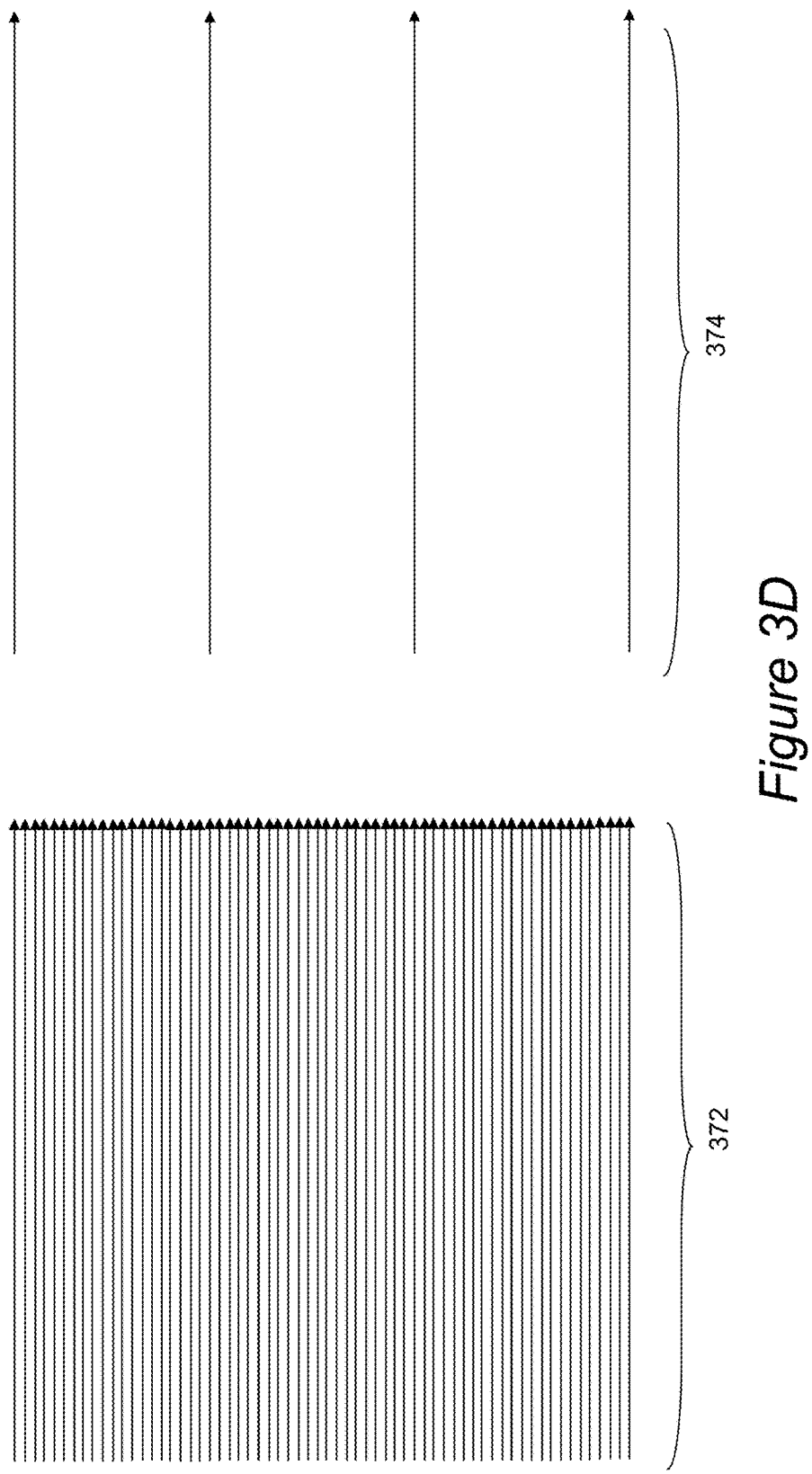

SCAN STRATEGIES TO MINIMIZE CHARGING EFFECTS AND RADIATION DAMAGE OF CHARGED PARTICLE BEAM METROLOGY SYSTEM

CROSS-REFERENCE TO RELATED APPLICATIONS

This application claims the benefit of prior application U.S. Provisional Application No. 62/639,603, filed 7 Mar. 2018 by Hong Xiao, which application is herein incorporated by reference in its entirety for all purposes.

BACKGROUND

The present invention relates generally to measurement techniques that are used in semiconductor manufacturing processes. More specifically, the present invention relates to techniques for measuring overlay error between different layers or different patterns on the same layer of a semiconductor wafer stack, as well as measuring other characteristics such as critical dimension (CD).

An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). The structures may take the form of gratings, and these gratings may be periodic. If the two layers or patterns are properly formed, then the structure on one layer or pattern tends to be aligned in a specific measurable orientation relative to the structure on the other layer or pattern. If the two layers or patterns are not properly formed, then the structure on one layer or pattern tends to be offset or misaligned with respect to this specific orientation.

There continues to be a need for improved techniques and apparatus for measuring and determining overlay.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of performing overlay metrology upon a target having at least two layers formed thereon is disclosed. A target having a plurality of periodic structures for measuring overlay in at least two overlay directions is provided. A charged particle beam is scanned in a first direction across a plurality of scan swaths of the target and at a first tilt with respect to the target so that each edge of the periodic structures is scanned at an angle. The charged particle beam is scanned in a second direction, which is opposite the first direction, across the plurality of scan swaths and at a second tilt that is 180° from the first tilt. The first and second direction scanning operations are then repeated for different first and second tilts and a different plurality of scan swaths of the target so that the target is scanned symmetrically. Images that are generated by the first and second direction scanning operations are combined to form a combined image, and an overlay error of the target is determined and reported based on analyzing the combined image.

In one example, the target includes periodic structures for both X and Y overlay, and repeating the first and second direction scanning operations results in the target being scanned at angles of 45°, 135°, 225°, and 315°. In a further aspect, the angles of 45°, 135°, 225°, and 315° are achieved by scanning the charged particle beam in both the first and second directions and rotating and translating the target to be scanned in a raster pattern. In another aspect, these angles are achieved by scanning the charged particle beam in a single translational direction and rotating the target to each of the angles 45°, 135°, 225°, and 315°.

In a specific implementation, charging effects on the periodic structures caused by the second direction scanning operation are symmetric with respect to charging effects caused by the first direction scanning operation. In another embodiment, the combined image has symmetrical charging effects due to the first and second direction scanning operations.

In another aspect, the first and second scanning operations include skipping a plurality of skipped lines of the periodic structures between each sequential pair of scan swaths, and the combined image excludes image portions for such skipped lines. In this aspect, the skipped lines have a count of 8 or more. In another example, the skipped lines have a count of 100 or more.

In another specific implementation, the periodic structures include X and Y line gratings, and the scan swaths are kept from being parallel to any longitudinal axis of such X and Y line gratings. In another aspect, the periodic structures include a first line grating having a longitudinal axis in a first direction and a second grating in a second direction that differs, and is not perpendicular, to the first direction, and the scan swaths are kept from being parallel to any longitudinal axis of such first and second line gratings.

In another aspect, the first and second scanning operations include skipping a plurality of skipped lines of the periodic structures between each sequential pair of scan swaths, and the combined image excludes image portions for such skipped lines, wherein the skipped lines have a count of 8 or more. In another example, the skipped lines have a count of 100 or more. In another implementation, the periodic structures include X and Y line gratings, and the scan swaths are kept from being parallel to any longitudinal axis of such X and Y line gratings. In another aspect, the periodic structures include a first line grating having a longitudinal axis in a first direction and a second grating in a second direction that differs, and is not perpendicular, to the first direction, and the scan swaths are kept from being parallel to any longitudinal axis of such first and second line gratings.

In an alternative embodiment, the invention pertains to a charged particle beam system for performing overlay metrology upon a target having at least two layers formed thereon. The system includes a beam source for generating a charged particle beam and optics for directing and scanning the particle beam onto a target having a plurality of periodic structures for measuring overlay in at least two overlay directions. The system further includes a stage for holding and moving the target positioned thereon with respect to the charged particle beam and a detector assembly for receiving signals from the target in response to scanning of the charged particle beam across the target. The system further includes a controller configured for performing any of the above described operations in coordination with the beam source, optics, stage, and detector assembly.

These and other aspects of the invention are described further below with reference to the figures.

BRIEF DESCRIPTION OF THE DRAWINGS

FIG. 3A is a top plan view of a combination XY overlay mark for which an alternate symmetric beam scan pattern may be used in accordance with a specific implementation of the present invention.

FIG. 3B illustrates an alternative beam scan pattern having scan paths that are 45° with respect to a combination XY target in accordance with a specific implementation of the present invention.

FIG. 3D is a diagrammatic representation of a symmetric scanning process that includes line skips in accordance with an alternative embodiment of the present invention.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

In general, an overlay error between two process layers or a shift between two sets of structures on the same layer may be determined using specially designed overlay targets, for which the target structures are designed with a known relationship between their symmetry characteristics and discrepancies from such symmetry correspond to overlay error in such targets. As used herein, a layer may refer to any suitable materials, such as a semiconductor or a photoresist layer that are generated and patterned for fabrication of a wafer device or test structure. Although the following target examples are shown to have structures on two (or more) layers for measuring overlay, it is readily apparent that each target may include two (or more) sets of structures on the same layer for determining a shift error between such set of structures. Additionally, techniques of the present invention may be applied to any type of periodic targets, and such targets may be formed in an inactive area (e.g., scribe line) or in an active region of a die on of a production wafer (e.g., as part of a device portion of a die). Techniques that are described herein may also be applied to targets for determining other types of characteristics, such as critical dimension (CD), CD uniformity (CDU), edge placement error (EPE), pattern fidelity, etc.

Figure 1:
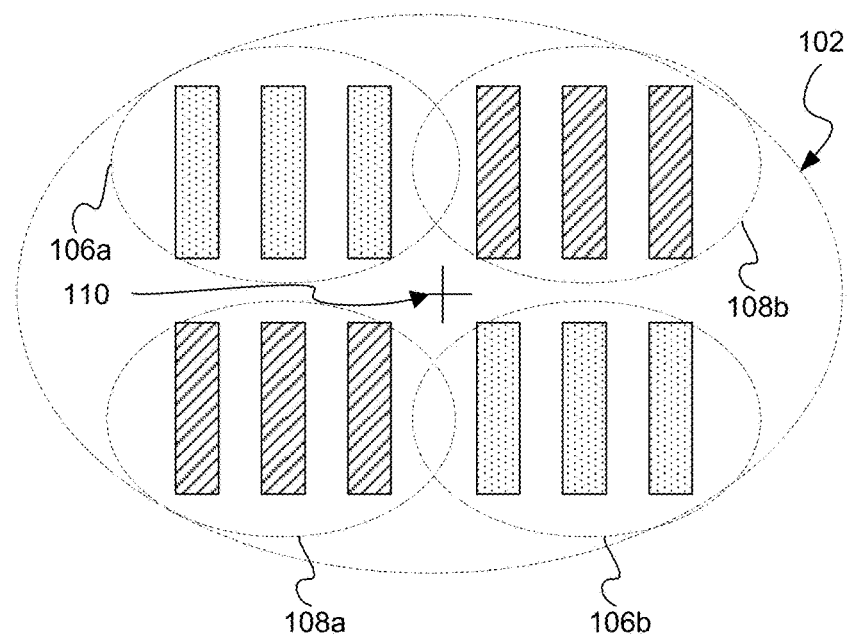
FIG. 1 is a top plan view of two overlay targets for measuring overlay error between two different process layers in an X and Y direction, respectively.
Figure 1:
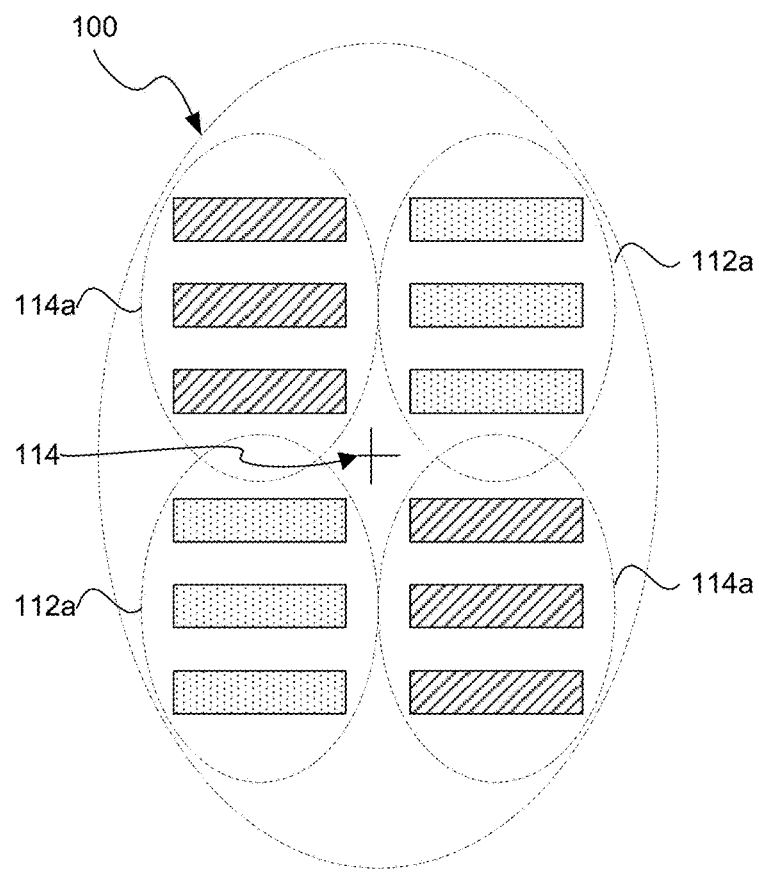

FIG. 1 is a top plan view of two overlay targets for measuring overlay error between two different process layers in an X and Y direction, respectively. As shown, a first target 102 is arranged for measuring an overlay error between a set of first structures 106a and 106b in a first layer and a set of second structures 108a and 108b in a second layer with respect to an X direction. A second target 100 is arranged for measuring an overlay error between a set of first structures 112a and 112b in a first layer and a set of second structures 114a and 114b in a second layer with respect to a Y direction.

In this embodiment, each of the X and Y targets are designed so that its first structures have a same 180° rotational center of symmetry as its second structures although the X direction target 102 is designed to have a center of symmetry (COS) 110 that has a different location than the Y direction target 104 COS 114. For example, the X direction target 102 has first structures that are divided into two groups 106a and 106b that are positioned with respect to each other so that if they were rotated 180° about a center of symmetry 110, the first structures would have a same appearance before and after such rotation. The X direction target 102 also includes second structures that are divided into two groups 108a and 108b that are positioned with respect to each other so that if they were rotated 180° about a center of symmetry 110, these second structures would have a same appearance before and after such rotation. In this illustration, the COS of the first structures is at the same position as the COS of the second structures. When an overlay error is present within a target, the COS of the first structures of such target is shifted from the COS of the second structures. This shift is called the overlay error.

In some targets, the overlay error in separate X and Y targets may be determined based on a priori knowledge that each target is designed to have structures in each layer that have a 180° rotational symmetry about a same COS. Any shift between the COS's of the first and second layer structures may be imaged and measured as an overlay error. In alternative embodiments, the X and/or Y targets of FIG. 1 may be arranged so that the first and second structures have a COS with a known offset. In this case, if the shift does not match the known offset, the amount of variance corresponds to the overlay error.

In general, a measurement on overlay targets can be performed with an optical measurement system after or during a photoresist development inspection (ADI) step. If overlay is assessed after development of the photoresist, for example, the wafer can be reworked if the overlay results are out of specification. As the device feature size scales down, however, the pattern of an optical target will tend to be much larger than the real device pattern and not provide reliable results. Thus, a scanning electron microscope (SEM), which can resolve and image much smaller patterns, becomes more attractive for overlay measurement applications.

SEM overlay (SEM-OVL) or e-beam overly (eOVL) measurements have mainly been used after etch inspection (AEI), which is also called after clean inspection (ACI), to calibrate any non-zero bias between scribe line ADI measurements of optical overlay and the overlay in real devices after etch. Of course, IC manufacturers are also interested in applying SEM-OVL/eOVL in ADI applications. Although the following overlay determination techniques may utilize electron beam scanning metrology systems, it is contemplated that similar techniques may be used with any suitable type of charged beam system.

For SEM or e-beam ADI applications, high landing energy (LE) may be needed to allow primary electrons not only to penetrate the layer under the photo-resist (PR) layer to reach the target structures of the underlying layer, but also to allow backscattered electrons (BSE) to also reach the detector. Because the BSE signal usually is significantly lower than the secondary electron (SE) signal, higher beam current is preferred. However, an e-beam with higher LE and higher beam current may also cause charging and e-beam induced PR damage.

Figure 2A:
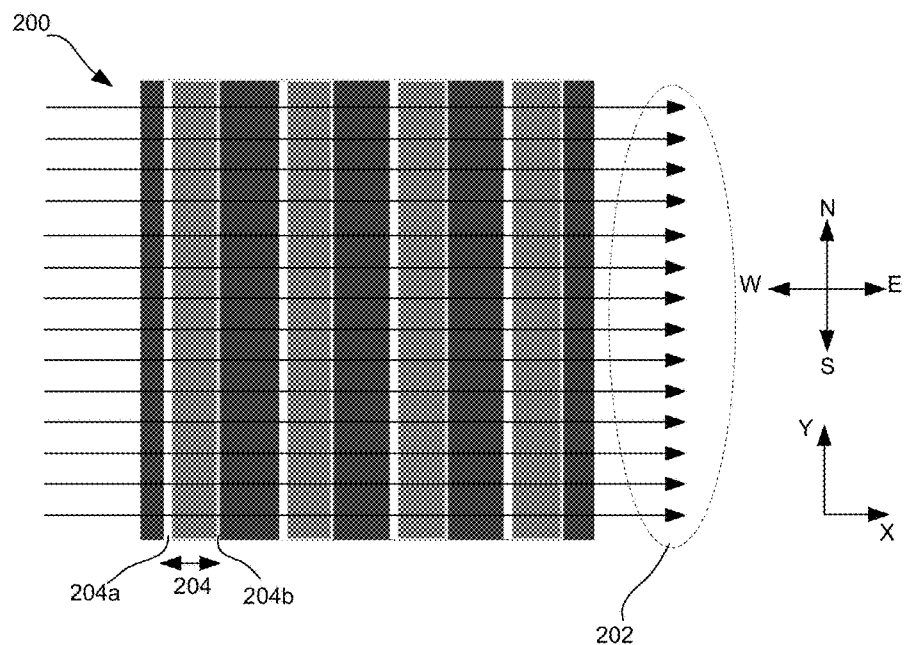
FIG. 2A illustrates asymmetric imaging of a grating target by scanning in an X direction with a charged particle beam.
Figure 2B:
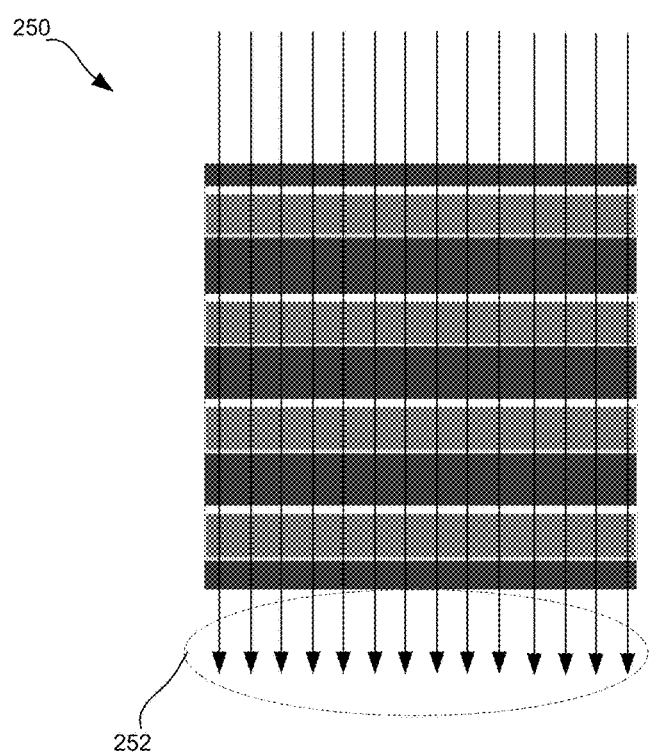
FIG. 2B illustrates asymmetric imaging of a grating target by scanning in an Y direction with a charged particle beam.

FIG. 2A illustrates asymmetric imaging of a grating target portion 200 caused by scanning in an X direction (specifically, in a west and east direction) with a charged particle beam. As shown, a charged particle beam is raster scanned in a scan pattern 202 that is in an "east" direction relative to the lines of the target 200. For each scan, the beam scans along a plurality of scan paths 202 that are each in a direction that is perpendicular to the line structures of the grating target 200. FIG. 2B illustrates similar asymmetric imaging of a grating target 250 that is caused by scanning in a single Y (or south) direction with a charged particle beam.

In either the X or Y target examples, the line structures asymmetrically retain charge from the charged particle beam as it scans across the line structures and, as a result, the periodic line image is asymmetric. For instance, leading edge 204a of line 204 may have a thicker white edge in the resulting image than the trailing edge 204b of the same line 204. This asymmetry may be caused by uneven positive charging of the line edges as the beam moves across such lines, which results in unequal amounts of secondary electrons from the different edges reaching the detector and contributing to the image.

Figure 2C:
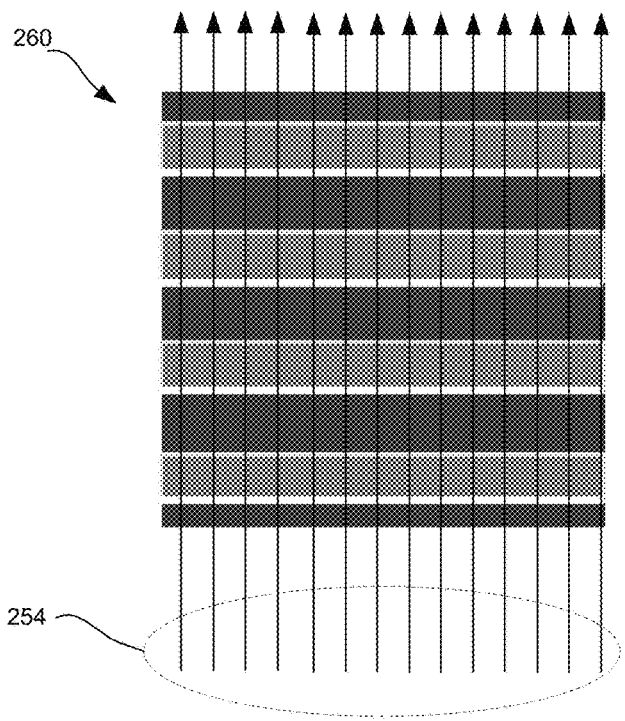
FIG. 2C illustrates a process for symmetrically scanning the charged particle beam back across the grating target in a direction that is opposite of the charged particle beam scan illustrated in FIG. 2B.

Certain embodiments of the present invention provide symmetric scanning patterns that result in symmetric charging effects for the image generated for the sample, which also results in symmetric PR damage. In one example, a charged particle beam (e.g., e-beam) is simply scanned back across the line structures so as to have two opposite-direction scans for each scanned line position (or each scanned swath). FIG. 2C illustrates a process for symmetrically scanning the charged particle beam back across a Y direction grating target in a direction that is opposite of the charged particle beam scan illustrated in FIG. 2B to result in target image 260. As shown, e-beam scans 254 will tend to result in asymmetry between the leading and lagging edges in the target image 260, which is opposite the asymmetry in the target image 250 that is caused by asymmetric beam scans 252 as shown in FIG. 2B. Combining images from the bidirectional (opposite or symmetrical) scans will tend to result in symmetrical charging effects in the combined image.

Figure 2D:
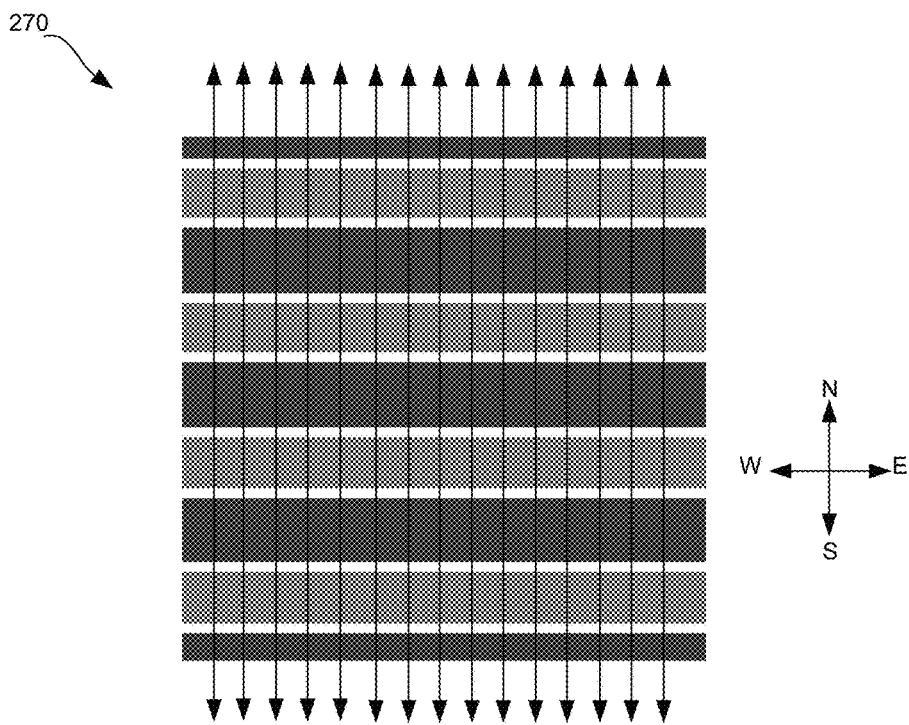
FIG. 2D illustrates a scanning pattern that includes symmetrical beam scans that are perpendicular to Y direction grating structures, which can be used to form a symmetric combined image in accordance with one embodiment of the present invention.

FIG. 2D illustrates a scanning pattern that includes symmetrical beam scans that are perpendicular to the Y direction grating structures, which can be used to form a symmetric combined target image 270 in accordance with one embodiment of the present invention. Said in another way, a charged particle beam is scanned symmetrically in both a "north" direction (up) and a "south" direction (down) with respect to the longitudinal axis of each line in the grating that is oriented in an east and west direction.

A similar technique can be implemented with respect to an X direction overlay target. For example, the target image 200 of FIG. 2A was obtained from grating lines that each have a north and south aligned longitudinal axis. In this example, a beam may also be scanned in a west direction that is opposite the east-direction beam scan 202 to thereby achieve symmetrical east and west direction scans relative to the overlay target grating 200. The images from the symmetric scans (east and west) may then be combined to form a symmetric image.

In sum, e-beam patterns that scan in both +X and −X (east and west) directions or in both +Y and −Y (north and south) directions can be used to form combined symmetric target images for X and Y direction grating structures, respectively. The asymmetries in the two different images that were formed by the two directional, but symmetrical, scans may then be combined to form a symmetric image. The symmetric image may then be analyzed for accurate overlay (or other measurements, such as CD) determination.

Although symmetric (or bi-directional) beam scans that are perpendicular to the grating targets work well for single direction (X or Y) targets, a different orientation of the symmetric scans may be used with respect to a multidirectional targets (e.g., X and Y target). FIG. 3A is a top plan view of a combination XY overlay mark 330 for which an alternate symmetric beam scan pattern may be implemented in accordance with a specific embodiments of the present invention as described further below. Unlike the targets of FIGS. 2A and 2B, the overlay mark 330 of FIG. 3A is configured to measure overlay in two separate directions. As such, mark 330 obviates the need to have one mark for each direction in which overlay needs to be measured. Overlay mark 330 is shown in a configuration that results when the tested layers of a wafer are in perfect alignment. The overlay mark 330 is generally provided to determine the relative shift between two or more successive layers of a wafer or between two or more separately generated patterns on a single layer of a wafer. For ease of discussion, the overlay mark 330 will be described in context of measuring overlay between different layers of a substrate. It should be noted, however, that the overlay mark in this figure (or any other target described herein) may also be used to measure two or more separately generated patterns on a single layer of a substrate.

The overlay mark 330 includes a plurality of working zones 332 for determining the registration error between two wafer layers in two different directions. In the illustrated embodiment, the overlay mark 330 includes eight rectangular shaped working zones 332, which are configured to substantially fill its perimeter 79. The working zones 332 represent the actual areas of the mark that are used to calculate alignment between different layers of the wafer. The working zones 332 are spatially separated from one another so that they do not overlap portions of an adjacent working zone. In this particular configuration, some of the working zones are separated via exclusion zones while other working zones are positioned next to an adjacent working zone. For example, working zone 332B is separated from working zones 332E and 332F via an exclusion zone 333 while working zones 332E and 332F are positioned next to one another at their edges without an exclusionary zone there between.

To facilitate discussion, the working zones 332 are grouped into a first working group 334 and a second working group 336. The first working group 334 includes four working zones 332A-D that are configured to provide overlay information in a first direction. By way of example, the first direction may be the Y direction. Of the four working zones 332A-D, two of them 332A and 332D are disposed in the first layer and two of them 332B and 332C are disposed in the second layer (the first layer is represented by cross hatching, the second layer is represented by no cross hatching). As should be appreciated, for this mark configuration and in the case of zero overlay error (as shown), the centers of symmetry 335 of working zones 332A&D and working zones 332B&C coincide exactly. The second working group 336 includes four working zones 332E-H configured to provide overlay information in a second direction that is perpendicular to the first direction. By way of example, the second direction may be the X direction. Of the four working zones 332E-H, two of them 332E and 332H are disposed in the first layer and two of them 332F and 332G are disposed in the second layer (the first layer is represented by cross hatching, the second layer is represented by no cross hatching). Similarly to the above, for this mark configuration and in the case of zero overlay (as shown), the centers of symmetry 337 of working zones 332E&H and working zones 332F&G coincide exactly. In this target or any targets described herein, the centers of symmetry may also be offset by a predefined amount and a deviation from such predefined offset indicates an overlay error.

As should be appreciated, each of the groups 334 and 336 represents an "X"—configured mark (albeit offset). For example, working group 334 includes working zones 332A&D, which are on the same first layer and in diagonally opposed positions relative to one another, and working zones 332B&C, which are on the same second layer and in diagonally opposed positions relative to one another. Further, working zones 332A&D are angled relative to working zones 3322B&C. Further still, working zone 332A is spatially offset from working zone 332D, and working zone 332B is spatially offset from working zone 332D.

In addition, working group 336 includes working zones 332E&H, which are on the same first layer and in diagonally opposed positions relative to one another, and working zones 332F&G, which are on the same second layer and in diagonally opposed positions relative to one another. Further, working zones 332E&H are angled relative to working zones 332F&G. Further still, working zone 332E is spatially offset from working zone 332H, and working zone 332F is spatially offset from working zone 332G. In essence, this particular mark produces two "X" configured marks that are positioned orthogonal to each other, i.e., working group 394 and working group 396.

To elaborate further, a working zone on one layer is generally juxtaposed relative to a working zone on another layer. For example, in the first working group, working zone 332A is juxtaposed relative to working zone 332B and working zone 332C is juxtaposed relative to working zone 332D. Similarly, in the second working group, working zone 332E is juxtaposed relative to working zone 332H and working zone 332F is juxtaposed relative to working zone 332G. Of the two juxtaposed pairs, the working zone on the second layer is typically positioned closer to the center than the working zone on the first layer. For example, working zones 332B and 332C and working zones 332F and 332G are positioned closer to the center 342 of the region of interest 344 than their juxtaposed working zones 332A and 332D and working zones 332E and 332H, respectively. Furthermore, within each of the working groups, the juxtaposed pairs are positioned in an opposed relationship (e.g., diagonal) relative to the other juxtaposed pair in the group. For example, juxtaposed pairs 332A&B are positioned opposite juxtaposed pairs 332C&D, and juxtaposed pairs 332E&F are positioned opposite juxtaposed pairs 332G&H.

As should be appreciated, in this particular mark, the configuration of the working zones is rotationally symmetric (+90, 180, 270, 360 degrees around the center of the mark). This is typically done to reduce the impact of radial and axial variations across the field of view of the metrology tool, as for example, radial and axial variations caused by non-uniform optical aberrations and illumination that may cause tool induced shifts (TIS). Radial variations generally refer to variations that radiate from the center of the mark to the outer regions of the mark. Axial variations generally refer to variations that occur in directions along the axis of the mark, as for example, in the X direction from the left to the right portions of the mark, and in the Y direction from the lower to the upper portions of the mark.

Each of the working zones 332A-H includes a periodic structure 338 comprised of a plurality of coarsely segmented lines 340. The linewidths, D, and spacings, s, of the coarsely segmented lines may be widely varied. As shown, each of the periodic structures 338 substantially fills the perimeter of its corresponding working zone 332. As should be appreciated, the periodic structures 338 are also disposed on the layer of its corresponding working zone 332.

For ease of discussion, the periodic structures 338 may be broken up into a first periodic structure 338A that is associated with the first working group 334 and a second periodic structure 338B that is associated with the second working group. As shown, the first periodic structures 338A are all oriented in the same direction, i.e., the coarsely segmented lines 340 are parallel and horizontally positioned relative to each other. The second periodic structures 338B are also all oriented in the same direction (albeit differently than the first periodic structures), i.e., the coarsely segmented lines 340 are parallel and vertically positioned relative to each other. As such, the periodic structures 338A in the first working group 334 are orthogonal to the periodic structures 338B in the second working group 336.

In one example, the coarsely segmented lines of juxtaposed periodic structures are aligned with one another, (e.g., if we ignore the different layers, they appear to be continuous gratings). For example, the coarsely segmented lines of working zone 332A may align with the coarsely segmented lines of working zone 332B and coarsely segmented lines of working zone 332C may align with the coarsely segmented lines of working zone 332D. In addition, the coarsely segmented lines of working zone 332E may align with the coarsely segmented lines of working zone 332F and coarsely segmented lines of working zone 332G may align with the coarsely segmented lines of working zone 332H.

For a multidirectional target, such as the XY target 330 of FIG. 3A, a symmetrical X or Y beam scan pattern would result in the e-beam being scanned along at least a portion of the target lines' longitudinal axis, which is generally avoided. For instance, an e-beam that is scanned bi-directionally along the X axis (east and west) would form scan paths that are perpendicular to the vertical lines of the second working group 336 and parallel with the horizontal lines of the first second working group 334. Likewise, an e-beam that is scanned bi-directionally in the Y direction (north and south) would form scan paths that were perpendicular to the horizontal lines of the first working group 334 and parallel to the vertical lines of the second working group 336.

In order to avoid scanning parallel along any of the lines of a multi-directional target, certain embodiments of the present invention include charged particle beam scan patterns that form symmetrical scan paths having angles with respect to the scanned edges that are at least 10° or in a range between about 10° and 80° from any of the lines of the target.

The scan paths may include pairs of scan paths at multiple rotations so as to maximize the symmetry in the final combined image. FIG. 3B illustrates an alternative beam scan pattern having symmetric scan paths that are 45° with respect to a combination XY target having both X and Y lines (e.g., target 330 of FIG. 3A) in accordance with a specific implementation of the present invention. In this example, multiple pairs of bi-directional line scans at two different rotations (or 4 different scan angles) symmetrically cover the target.

Figure 3C:
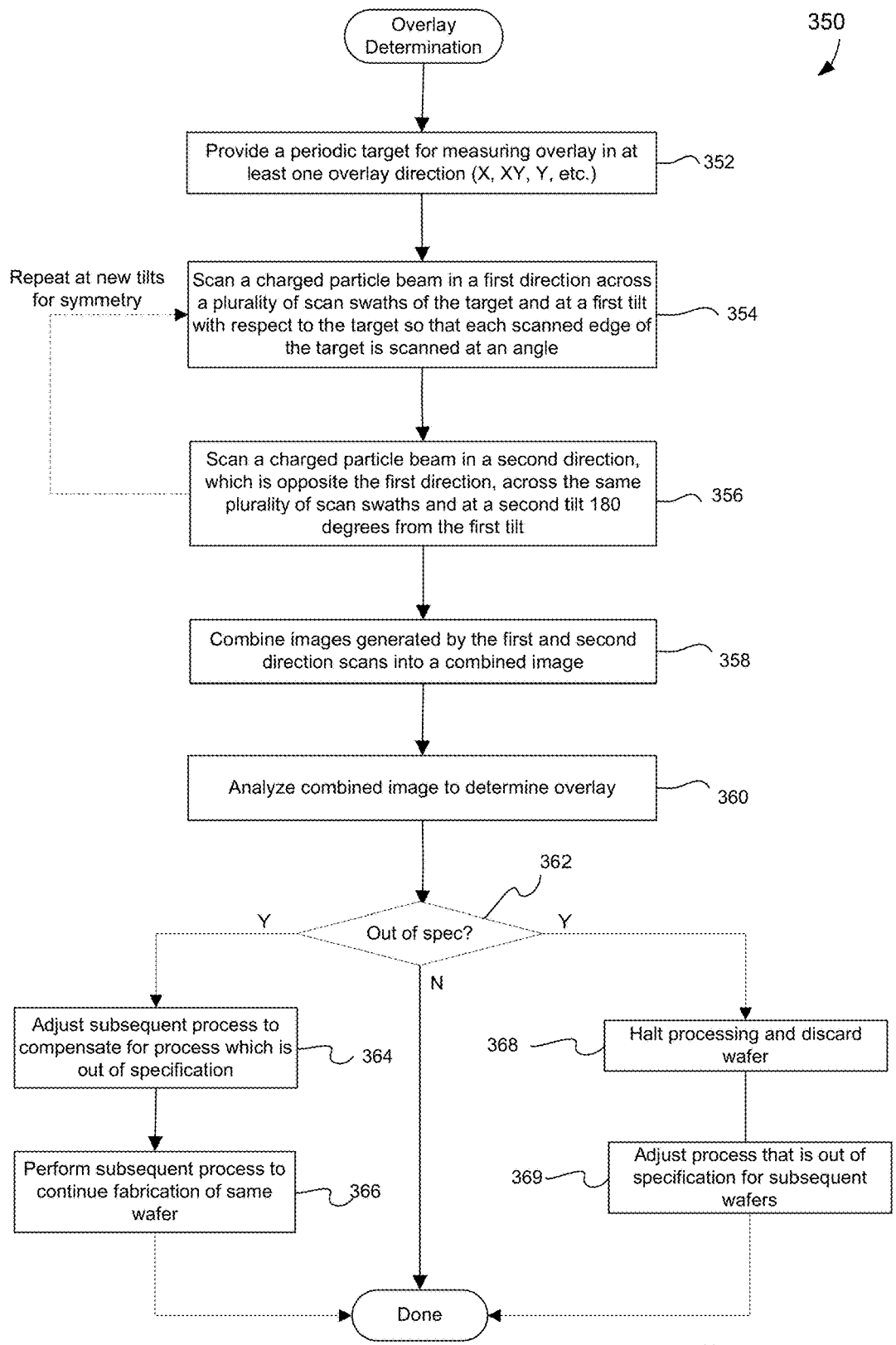
FIG. 3C is a flowchart illustrating a procedure for determining overlay with symmetric beam scanning in accordance with one embodiment of the present invention.

Any suitable technique may be used to symmetrically scan a periodic target. FIG. 3C is a flowchart illustrating a general procedure 350 for determining overlay with symmetric beam scanning in accordance with one embodiment of the present invention. Initially, a periodic target for measuring overlay in at least one direction is provided in operation 352 of FIG. 3C. For example, the target may include structures for only measuring overlay in a single direction (e.g., X or Y) or a target that includes structures for measuring overlay in two or more directions (e.g., X and Y), like the XY target 330 of FIG. 3A.

A charged particle beam may then be scanned in a first direction across a plurality of scan swaths of the target and at a first tilt with respect to the target so that each scanned edge of the target is scanned at an angle in operation 354. Additionally, the charged particle beam can then be scanned in a second direction, which is opposite the first direction, across the same plurality of scan swaths and at a second tilt that is 180° from the first tilt in operation 356. For a target that only includes X or Y overlay structures, the pattern of scans may include either scanning in north and south directions or scanning in east and west directions, respectively, across a plurality of scanned swaths For other types of targets such as a combination XY target, the scanning operations may be repeated at new tilts so as to achieve symmetry in the scans with respect to the target. As shown in the combination XY target example of FIG. 3B, the beam is scanned with respect to the target along sets of bidirectional swaths at tilts of 45°, 135°, 225°, and 315°. That is, scanned swaths for each first pair 342 are at 45° and 225°, and scan swaths of each second pair 344 are at 135° and 315°.

These scan swaths may be achieved by scanning the charged particle beam in two translational directions while the target is moved in a translational and rotational manner. For instance, the target is moved in a linear and rotational manner under the charged particle beam so as to scan the target in four frames. Said in another way, the target is moved perpendicular to the beam's scan direction so as to scan a first set of swaths in a first direction and at a first tilt (e.g., 45°). The target may then be rotated to a second tilt (e.g., 225°), which is 180° from the first tilt, so that the beam will effectively scan in a second opposite direction with respect to the first set of swaths. The target is then translated in a direction that is perpendicular to the beam's scan direction so as to scan the same first set of swaths in the second direction that is opposite the first direction. This process may then be repeated for the other two tilt pair 135° and 315°.

Of course, the charged particle may be scanned in two opposite linear directions, and the target may be rotated to only two tilt positions for such bidirectional beam scans. At each tilt position and beam direction, the target is translated under the beam in a direction that is perpendicular to the beam scan's direction so as to raster scan multiple lines in the beam's direction. For example, the target may be rotated and translated with respect to the charged particle beam so that the beam scans across a plurality of lines/swaths in two directions and at a first pair of tilts 45° and 225° with respect to the target. Next, the target is then rotated once more, and the target is translated so that the beam then scans across a plurality of lines/swaths in two directions and at a second pair of tilts 135° and 315° with respect to the target.

Symmetric charged particle scan patterns may likely result in improvements for the edge sharpness and symmetry for a wide variety of target configurations, such as an XY overlay target. In another embodiment, the beam is only scanned in opposite directions along either scan swaths 342 or scan swaths 344, with or without rotating the target to achieve the two symmetric directions along the same scan swaths.

In order to reduce damage, e.g., to the photoresist material, each sequential scan may skip swaths (or lines) in accordance with an alternative embodiment of the present invention. FIG. 3D is a diagrammatic representation of a symmetric scanning process that includes skipping lines in accordance with an alternative embodiment of the present invention. In contrast to a scan pattern 372 that is composed of sequentially scanned swaths that result in swath images that abut or overlap each other, the scan pattern 374 includes sequentially scanned lines that skip swaths or lines. For example, 8 lines are skipped between each sequential swath scan. Of course, the scan pattern would also include scans in the opposite direction (from right to left) that trace over the illustrated scan lines 374. Additionally, the skipped lines would be left unscanned, and overlay may be determined based on a combination of the signals or images that are generated in response to the beam moving across each of the scanned lines 374 in two opposite symmetrical directions. For example, symmetric image portions obtained in response to the scanned lines 374 are combined to form a combination image that excludes image data from skipped lines of the target.

Any suitable number of lines may be skipped so as to minimize damage to the scanned material and obtain enough data for accurately determining overlay or the like. In general, a scan pattern that skips lines causes less damage to certain materials such as photoresist, which tends to shrink in areas that are scanned by a charged particle beam. The number of skipped lines may be selected so that the amount of shrinkage will tend to be comparable to line edge roughness and not significantly affect the overall line edges. In one example, 8 or more lines are skipped. In other embodiments, 100 or more lines are skipped, for example, for an 8 k by 8 k field of view (FOV).

Regardless of whether skipping occurs during the symmetric scans, each swath scan results in generation of signals or images, for example, by the system's detector and processor system. Referring back to the illustrated process of FIG. 3C, the images from the first and second direction scans may then be combined into a combined image in operation 358. FIG. 2D shows a representation of a combined image for a Y direction target portion in which no lines are skipped. If lines are skipped, the image portions for the individually scanned lines may be compressed together so that they abut each other in the combined image. If 8 lines are skipped by way of example, the resulting combined image will be ⅛ the size of an image that is formed without skipping lines.

In general, images may be combined as each pair of scanned swaths of the target are collected. Alternatively, images may be combined after the images for all of the pairs of swaths for a particular overlay direction are collected or after the images for all pairs of swaths for all overlay directions are collected.

The combined image may then be analyzed to determine overlay (or another characteristic, such as CD) in operation 360. Each combined image for each scan swath may be analyzed separately or a single combined image for all the swaths may be analyzed.

It is then determined whether a process is out of specification in operation 362. One may determine whether the targets are within specification based on a combined image produced by embodiments of the present invention in any suitable manner, as further described herein. If a process is not out of specification, the procedure ends.

If a process is out of specification, a number of techniques may be implemented to alleviate the problem. In a first technique, a subsequent process may be adjusted to compensate for the process that is out of specification in operation 364. For example, if it is determined that the photoresist pattern is misaligned in any portion, the photoresist may then be stripped and reapplied in a corrected pattern to eliminate the misalignment. The subsequent process is then performed so as to continue fabrication of the same wafer in operation 366. For example, the wafer may be patterned. In a second technique, processing of the wafer may be halted and the wafer may then be discarded in operation 368. The process that is out of specification may then be adjusted for subsequent wafers in operation 369.

Figure 3E:
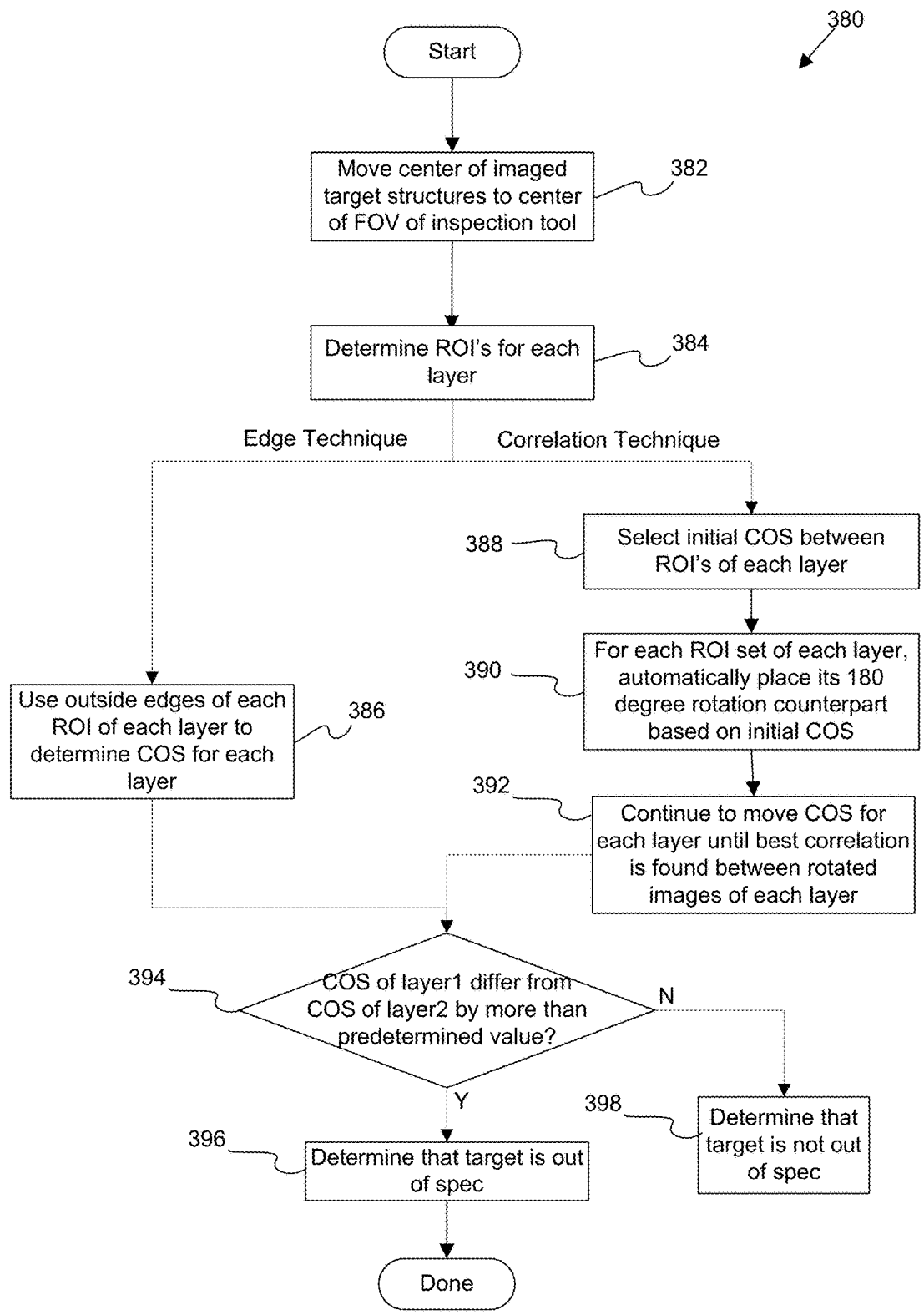
FIG. 3E is a flow chart illustrating the operation of FIG. 3C for determining whether a target is out of specification in accordance with a specific implementation of the present invention.

FIG. 3E is a flow chart illustrating the operation 362 of FIG. 3C for determining whether a target is out of specification in accordance with a specific implementation of the present invention. Although this procedure is described with respect to a target having structures with a 180° rotational COS, of course, this procedure may be easily modified for structures with mirror or other type of symmetry.

In the illustrated example of FIG. 3E, the center of the imaged target structures are initially moved to the center of the FOV of the inspection tool in operation 382. The region of interests (ROI's) of each layer are then determined in operation 384. The X target structures of FIG. 1 will be used to illustrate the procedure of FIG. 3E. For example, four ROI's may be formed for the X direction target structures 106a, 106b, 108a and 108b of FIG. 1, as represented by the dotted lines. The dotted line 102 may represent the FOV of the inspection tool, while the cross 110 represents the center of the X target structures.

The COS for each set of structures 106 and 108 from the first and second layers, respectively, may be determined using any suitable technique. For example, an edge technique may be utilized to determine COS for the structures in each layer. In the illustrated embodiment, the outside edges of each ROI of each layer are used to determine the COS for each layer in operation 386. For the structures 106 and 108, the outside edges of each ROI may be determined and then the edges are then used to find a center position between the outside edges of each set of structures (e.g., between structures 106a and structures 106b). For structures having sub-resolution features (e.g., target of FIG. 4A, which is described below), the edge of each set of sub-resolution lines (e.g., fine lines 404 that form part of each course set of lines 402) would be measured as a single edge.

Another COS determination technique is referred to as the correlation technique. In this technique, an initial COS position is estimated between the ROI's of the structures of each layer in operation 388. As shown for the structures 106, an initial estimate of COS 110 may be positioned between structures 106a and 106b. Two linear arrays are then obtained by measuring across the two sets of structures at positions that are equal distances from the initial COS. The structures 106a and 106b will tend to each result in a periodic signal with three peak intensity values. The two obtained linear arrays are then flipped horizontally and vertically and matched and a metric of correlation such as the product is calculated. The arrays are moved with respect to one another and the metric is calculated for each offset. The metric is then plotted and the correct COS is located by finding the maximum of the correlation metric. Intelligent searching algorithms (e.g., a binary search) may also be used to efficiently locate the correct COS position.

Said in another way, for each ROI set of each layer, its 180° rotation counterpart is automatically placed based on the initial COS in operation 390. The COS is continually moved for each layer until the best correlation is found between the rotated image and original images of each layer in operation 392. After the best correlation is found, the COS is found.

After the COS is found using any suitable technique, it is then determined whether the COS of the first layer structures differs from the COS of the second layer structures by more than a predetermined value in operation 394. If they do not differ by more than the predetermined value, it is determined that the target under analysis in not out of specification in operation 398. However, if they do differ by more than the predetermined amount, it is determined that the target under analysis is out of specification in operation 396. The procedure for determining whether the target is out of specification then ends.

Opposite direction and tilted (with respect to the overlay direction or longitudinal axis of the target lines) scan patterns may be applied to any suitable type of combination X and Y targets, besides the example of FIG. 3A. Several periodic overlay targets are further described in U.S. Pat. No. 9,702,693, issued 11 Jul. 2017 by Ghinovker et al., which patent is incorporated herein by reference. FIGS. 4A through 4I illustrate a plurality of different combination XY targets for which symmetric beam scanning techniques may be implemented in accordance with various embodiments of the present invention.

Figure 4A:
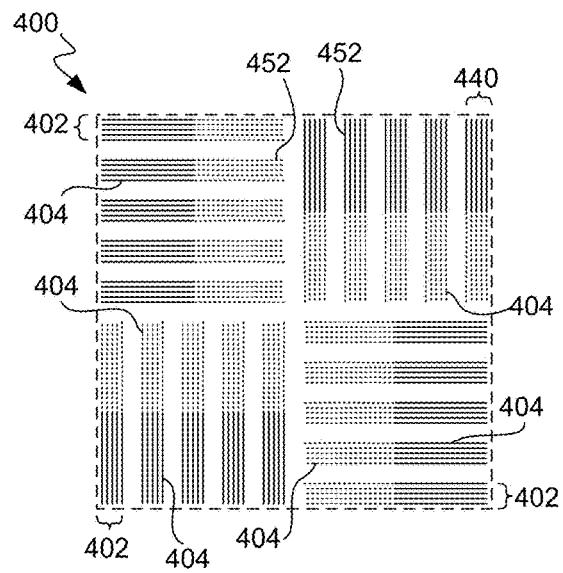
FIGS. 4A through 4I illustrate a plurality of different combination XY targets for which symmetric beam scanning techniques may be implemented in accordance with various embodiments of the present invention.

FIG. 4A is a top plan view of another multi-directional overlay mark 400. In this particular embodiment, the coarsely segmented lines 402 are formed by a plurality of finely segmented elements 404.

Figure 4B:
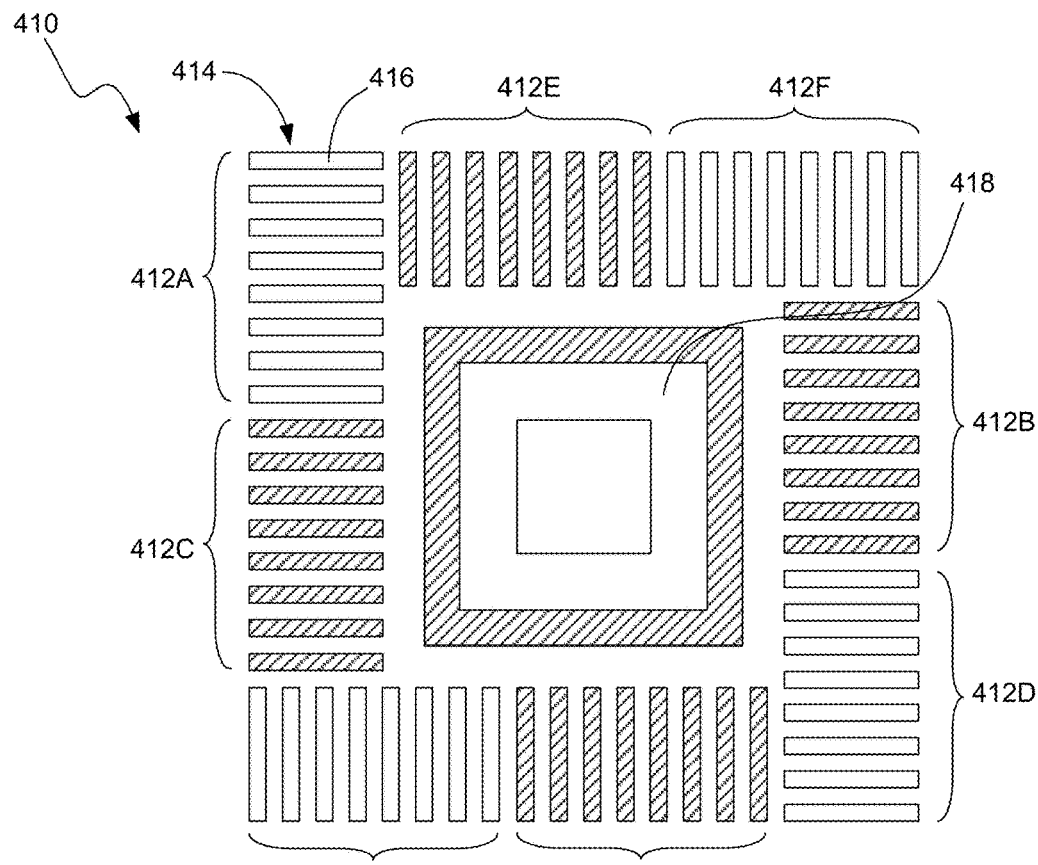

FIG. 4B is a top plan view of an overlay mark 410, in accordance with an alternate target. By way of example, the overlay mark 410 may generally include X and Y line gratings with the addition of a box in box overlay structure 418. Similarly to the overlay mark 330 of FIG. 3A, overlay mark 410 contains eight working zones 412A-H for determining the registration error between two wafer layers in two different directions (one layer is represented by cross-hatching, the other is not). Each of the working zones includes a periodic structure 414 comprised of a plurality of coarsely segmented lines 416. The working zones 412 are arranged to accommodate additional structure 418 in the center of the mark 410. In the illustrated embodiment, the working zones 412A-H are disposed around the outer region of the mark, while the additional structure 418 is disposed in the center of the mark. The additional structure 418 may represent a standard box in box overlay structure.

Figure 4C:
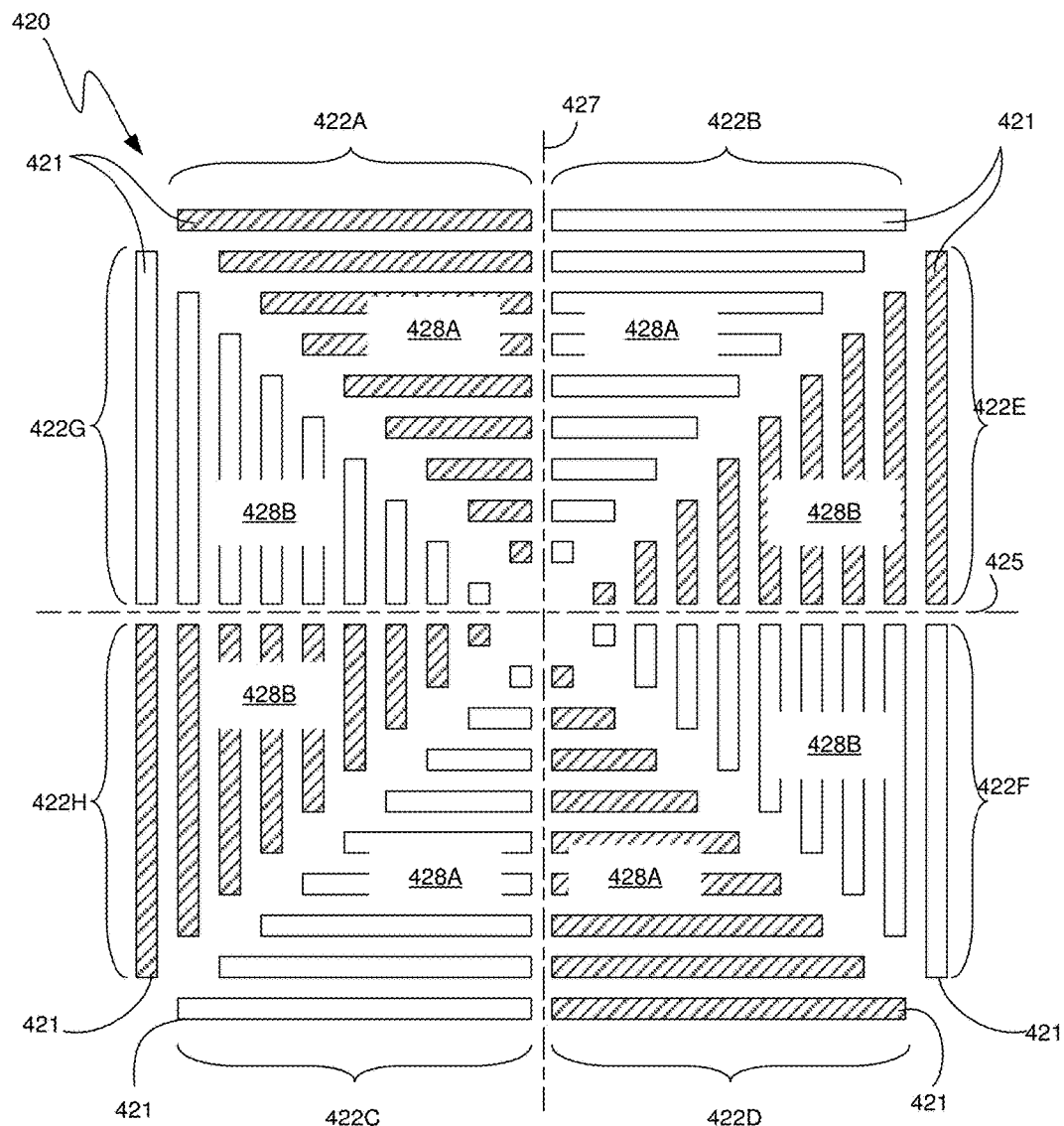

FIG. 4C is a top plan view of an overlay mark 420, in accordance with an alternate target. Like the mark of FIG. 3A, the overlay mark 420 of FIG. 4C is configured to measure overlay in two separate directions. In contrast to the mark of FIG. 3A, the mark 420 includes triangularly shaped working zones 422.

A first set of working zones 422A-D are configured to provide overlay information in a first direction. By way of example, the first direction may be the Y direction. Of the four working zones 422A-D, two of them 422A and D are disposed in the first layer and two of them 422 B and 422C are disposed in the second layer. As should be appreciated, for this mark configuration and in the case of zero overlay (as shown), the centers of symmetry 425 of working zones 422A&D and working zones 422B&C coincide exactly. A second set of working zones 422E-H are configured to provide overlay information in a second direction that is perpendicular to the first direction. By way of example, the second direction may be the X direction. Of the four working zones 422E-H, two of them 422E and 422H are disposed in the first layer and two of them 422F and 422G are disposed in the second layer. Similarly to the above, for this mark configuration and in the case of zero overlay (as shown), the centers of symmetry 427 of working zones 422E&H and working zones 422F&G coincide exactly. In addition, and all of the working zones 422 are equally positioned relative to the center of the mark. Each of the working zones 422 includes a periodic structure 428 comprised by a plurality of coarsely segmented lines 421. Although not shown, each coarsely segmented line may be formed by a plurality of finely segmented elements to further enhance this mark or any mark described herein.

Figure 4D:
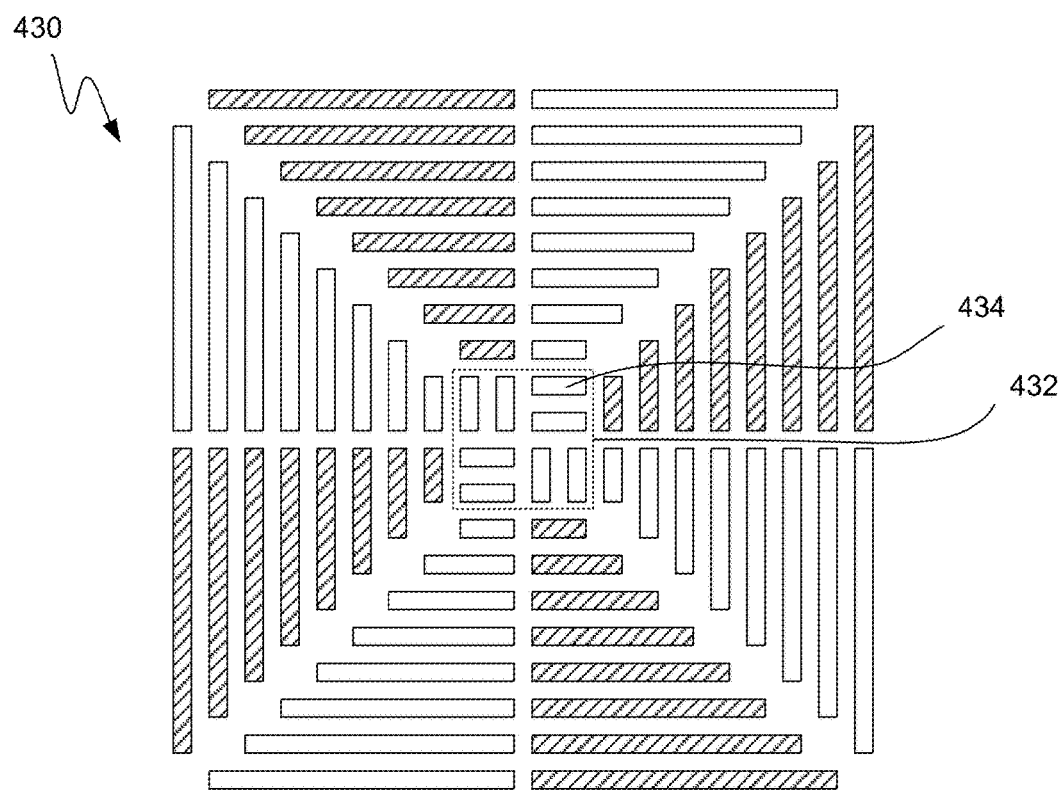

FIG. 4D is a top plan view of an overlay mark 430, in accordance with an alternative target. As shown, mark 430 has the same general layout and characteristics as mark 420 of FIG. 4C, i.e., eight triangularly shaped working zones. Mark 430 differs from mark 420, however, in that it biases the center of the mark with a grating pattern 432 formed on one of the two layers. The grating pattern 432 is typically used in cases where the mark quality in one layer is poorer than the mark quality in the other layer due to contrast or graininess. That is, the information (e.g., edges) in a layer where contrast is low is increased. Alternatively, biasing the center of the FOV with one layer may further protect it from process damage. The grating pattern 432 may be widely varied. For example, grating pattern may include any number of lines in any number of distributions and sizes. In this particular embodiment, the grating pattern is formed on the second layer and includes groups of two coarsely segmented lines 434 that alternate in direction (e.g., X and Y directions) around the center of the mark.

Figure 4E:
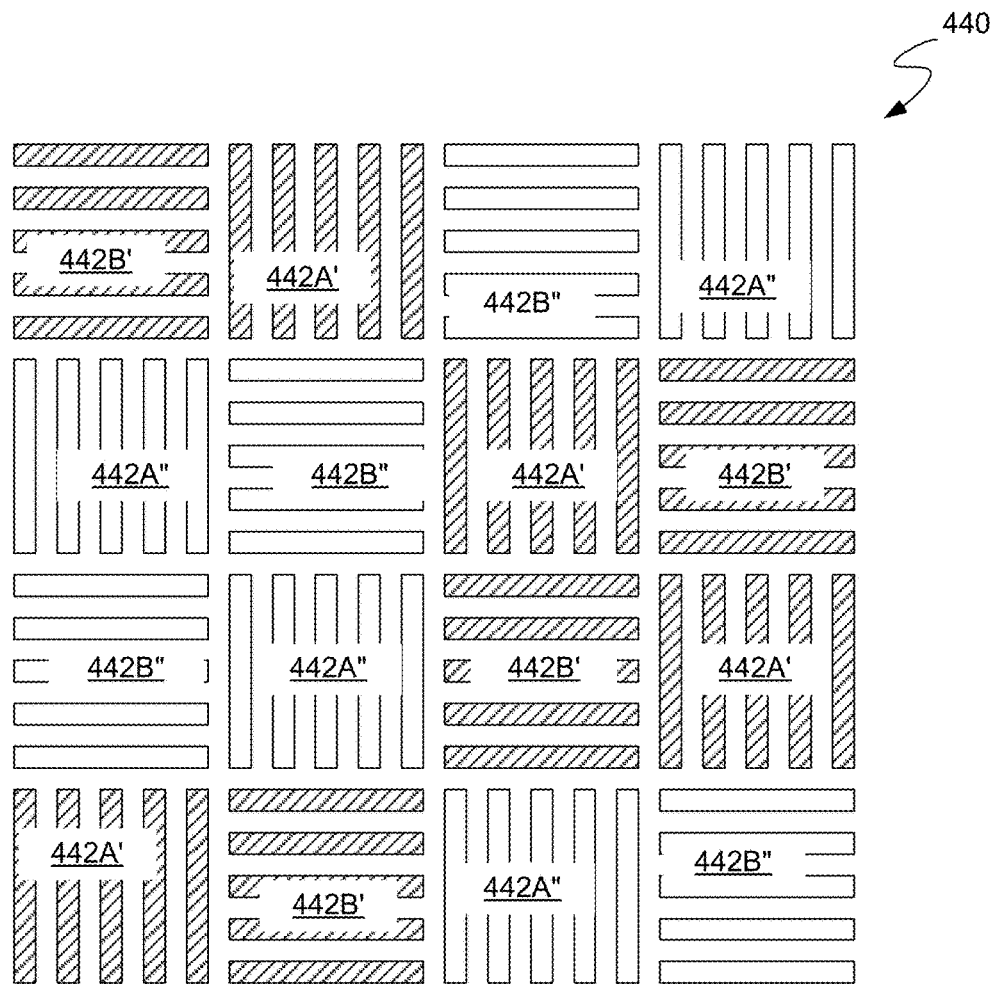

FIG. 4E is a top plan view of an overlay mark 440, in accordance with an alternate target. Like the overlay mark of FIG. 3A, overlay mark 440 is configured to measure overlay in two separate directions. The overlay mark 440 includes a plurality of working zones 442 for determining the registration error between two wafer layers in two different directions. In the illustrated embodiment, the overlay mark 442 includes sixteen square shaped working zones 442, which are configured to substantially fill its perimeter. Each of the working zones 442 includes a periodic structure of coarsely segmented lines. Of the 16 working zones, 8 of the working zones 442A are oriented in the X direction and 8 of the working zones 442B are oriented in the Y direction (as shown by the periodic structures disposed therein). Of the 8 working zones 442, in any given orientation (A or B), 4 of the working zones 442' are printed in a first layer (represented by cross hatching) while 4 of the working zones 442" are printed in a second layer (not represented by cross hatching).

Figure 4F:
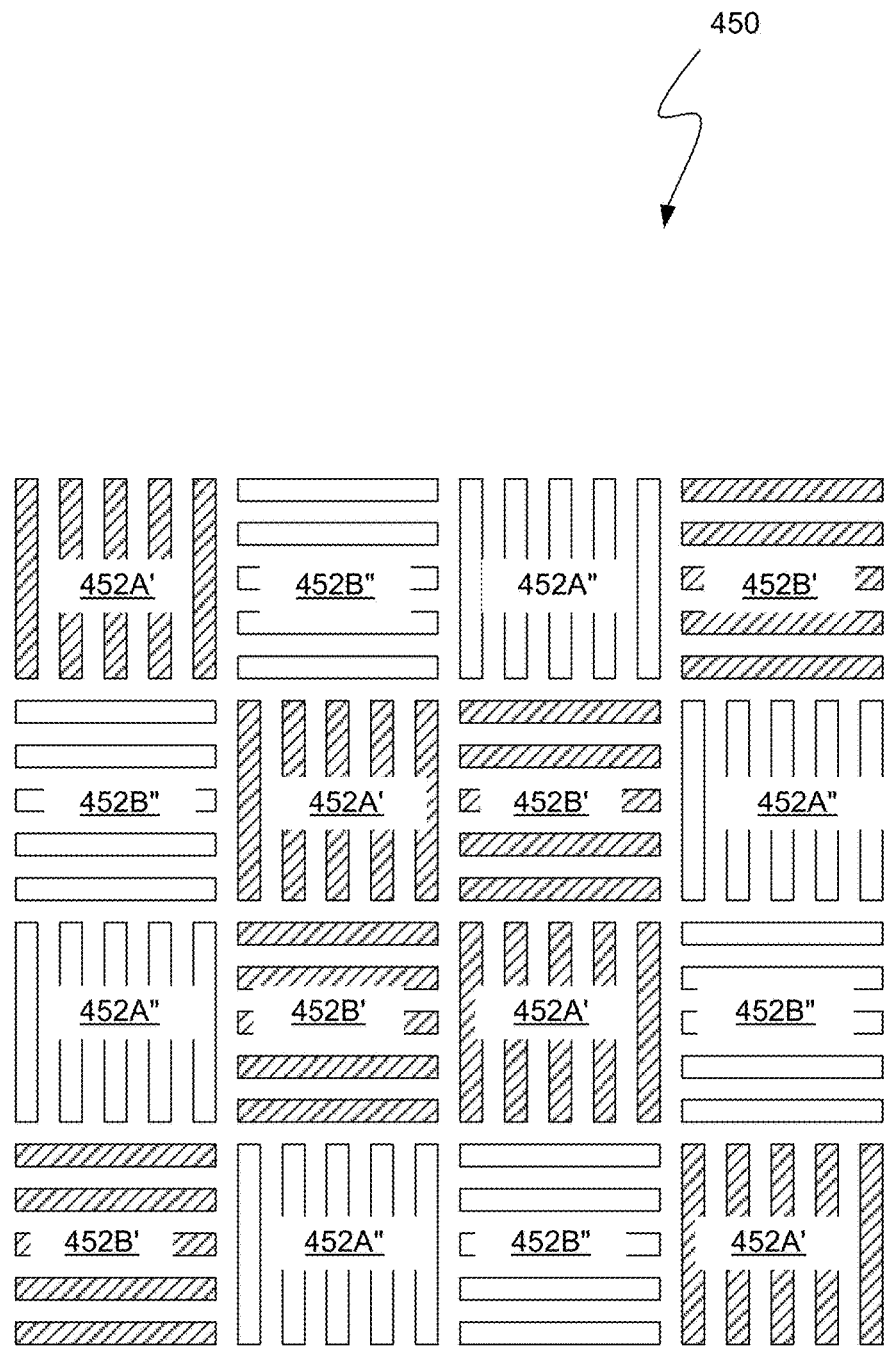

FIG. 4F is a top plan view of an overlay mark 450, in accordance with an alternate target. Like the overlay mark of FIG. 4E, overlay mark 450 is configured to measure overlay in two separate directions. The overlay mark 450 includes a plurality of working zones 452 for determining the registration error between two wafer layers in two different directions. Each of the working zones 452 includes a periodic structure of coarsely segmented lines. Of the 16 working zones, 8 of the working zones 452A are oriented in the X direction and 8 of the working zones 452B are oriented in the Y direction (as shown by the periodic structures disposed therein). Of the 8 working zones 452, in any given orientation (A or B), 4 of the working zones 452' are printed in a first layer (represented by cross hatching) while 4 of the working zones 452" are printed in a second layer (not represented by cross hatching).

Figure 4G:
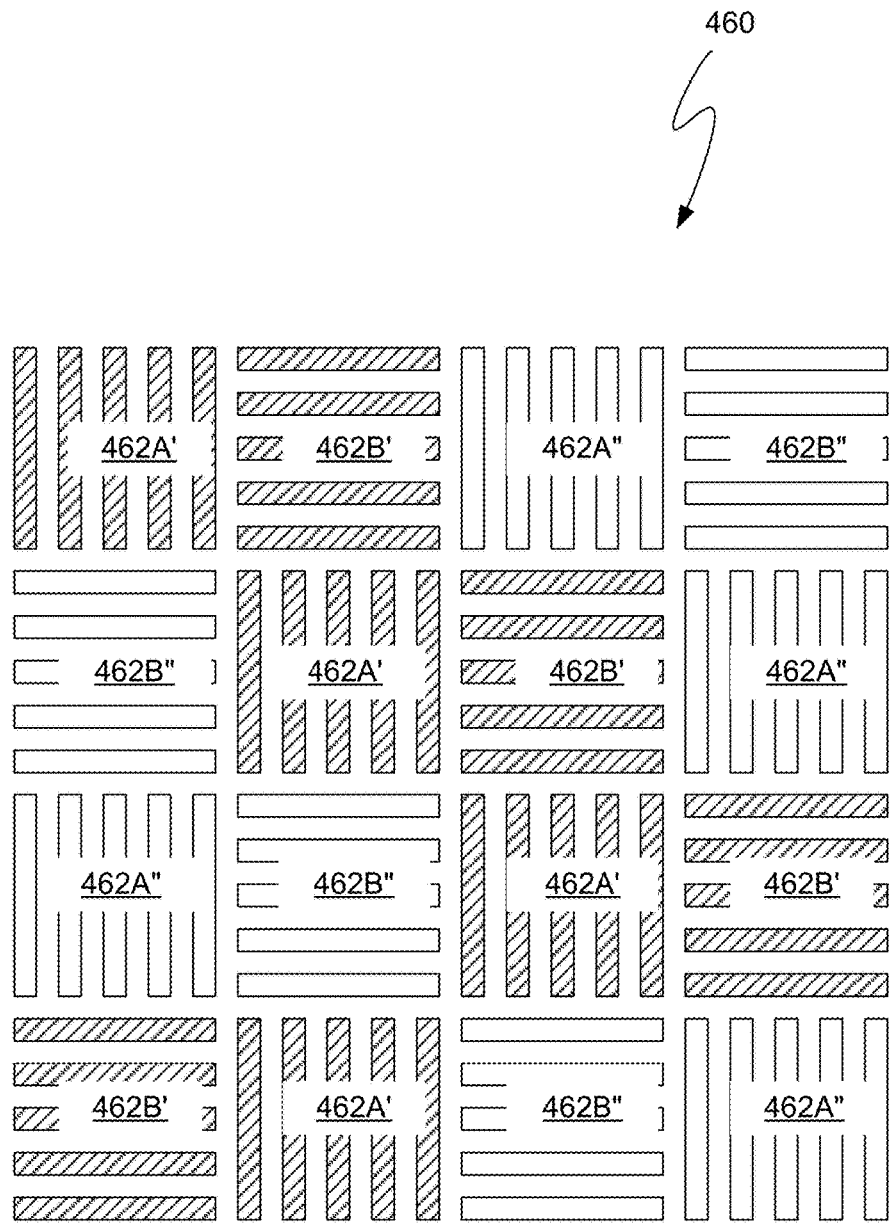

FIG. 4G is a top plan view of an overlay mark 460, in accordance with an alternate target. Like the overlay mark of FIG. 4E, overlay mark 460 is configured to measure overlay in two separate directions. The overlay mark 460 includes a plurality of working zones 462 for determining the registration error between two wafer layers in two different directions. Each of the working zones 462 includes a periodic structure of coarsely segmented lines. Of the 16 working zones, 8 of the working zones 462A are oriented in the X direction and 8 of the working zones 462B are oriented in the Y direction (as shown by the periodic structures disposed therein). Of the 8 working zones 462, in any given orientation (A or B), 4 of the working zones 462' are printed in a first layer (represented by cross hatching) while 4 of the working zones 462" are printed in a second layer (not represented by cross hatching).

Figure 4H:
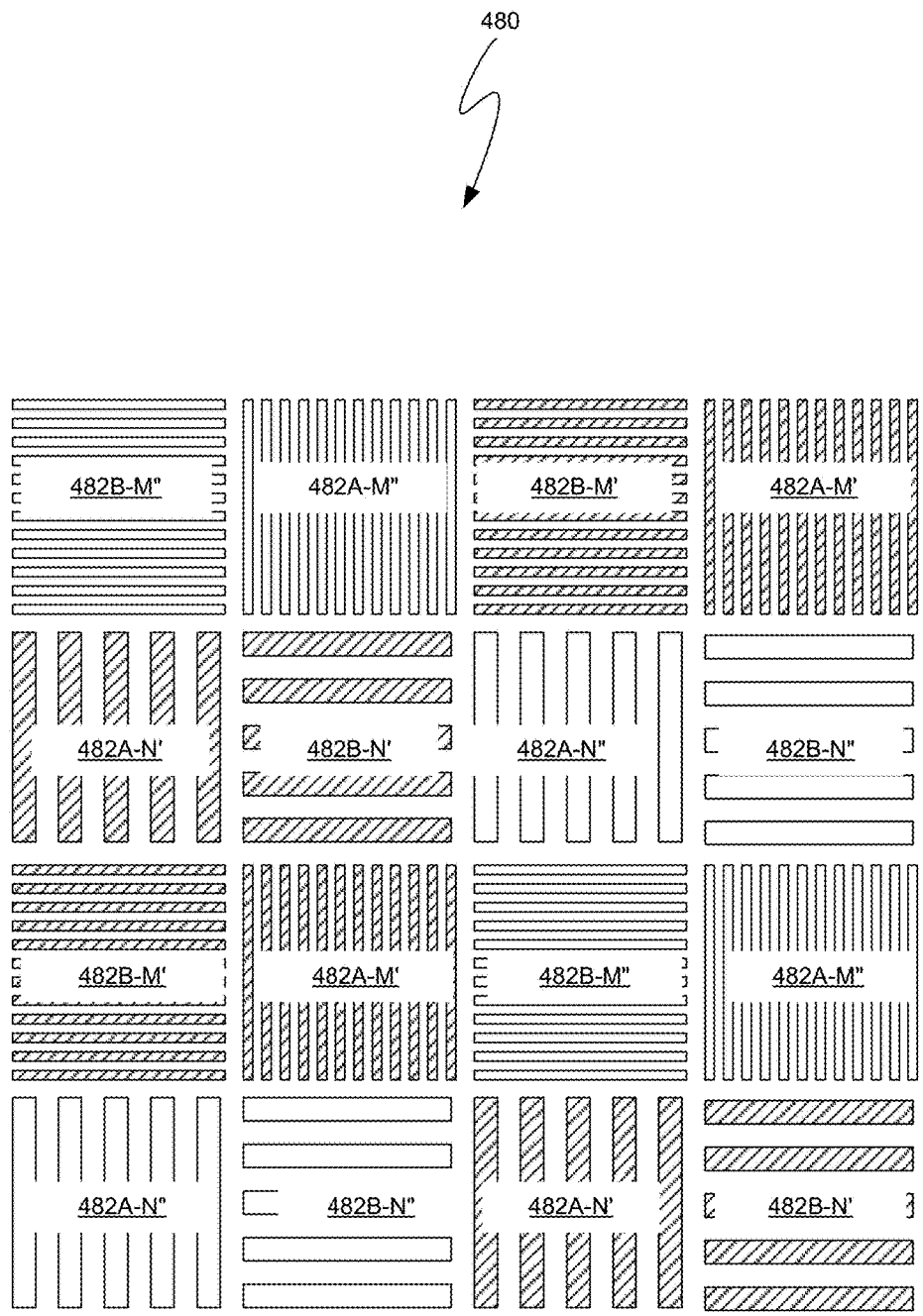

FIG. 4H is a top plan view of an overlay mark 480, in accordance with an alternate structure. Like the overlay mark of FIG. 4E, overlay mark 480 is configured to measure overlay in two separate directions. The overlay mark 480 includes a plurality of working zones 482 for determining the registration error between two wafer layers in two different directions. Each of the working zones 482 includes a periodic structure of coarsely segmented lines. Of the 16 working zones, 8 of the working zones 482A are oriented in the X direction and 8 of the working zones 482B are oriented in the Y direction (as shown by the periodic structures disposed therein). Of the 8 working zones 482, in any given orientation (A or B), 4 of the working zones 482' are printed in a first layer (represented by cross hatching) while 4 of the working zones 482" are printed in a second layer (not represented by cross hatching). Furthermore, of the 8 working zones 482, in any given orientation (A or B), 4 of the working zones 482 have a periodic structure M with a first period (represented by thinner lines) while 4 of the working zones 482 have a periodic structure N with a second period that is different than the first period (represented by wider lines).

Figure 4I:
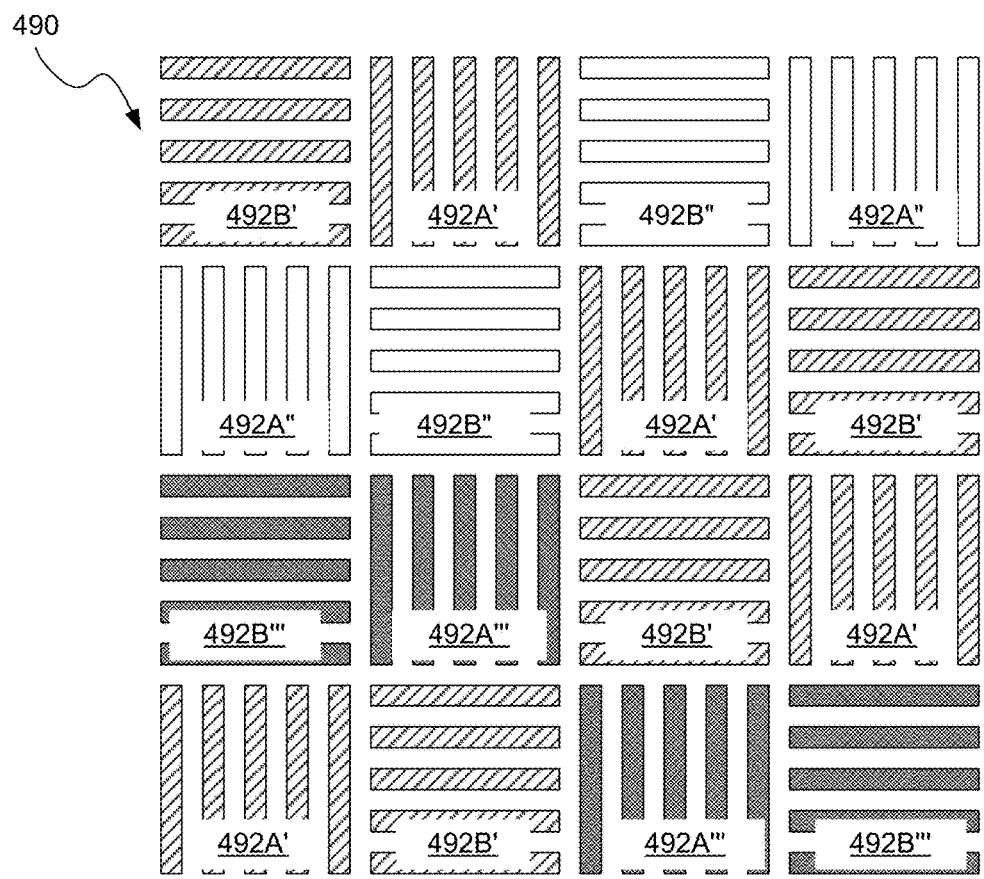

FIG. 4I is a top plan view of an overlay mark 490, in accordance with an alternate structure. Like the overlay mark of FIG. 4E, overlay mark 490 is configured to measure overlay in two separate directions. However, overlay mark 490 is also configured to determine the relative shift between three successive layers of a wafer or between three separately generated patterns on a single layer of a wafer. In the illustrated embodiment, the overlay mark 490 includes sixteen square shaped working zones 492. Each of the working zones 492 includes a periodic structure of coarsely segmented lines.

Of the 16 working zones 492, 8 of the working zones 492' are printed in a first layer (represented by cross hatching), 4 of the working zones 492" are printed in a second layer (represented by white fill), and 4 of the working zones 492''' are printed in a third layer (represented by black fill). In this particular embodiment, the first layer (also represented by a single prime) is disposed over the second layer (also represented by a double prime) and the second layer is disposed over the third layer (also represented by a triple prime). By way of example, the first layer may represent a resist layer, the second layer may represent a first metal layer, and the third layer may represent a second metal layer. It should be noted that the above configuration may be widely varied. For example, of the 8 working zones in any given orientation (A or B), 2 may be printed in a first layer, while each additional pair of gratings may be printed in up to any of 3 previous layers.

Figure 5:
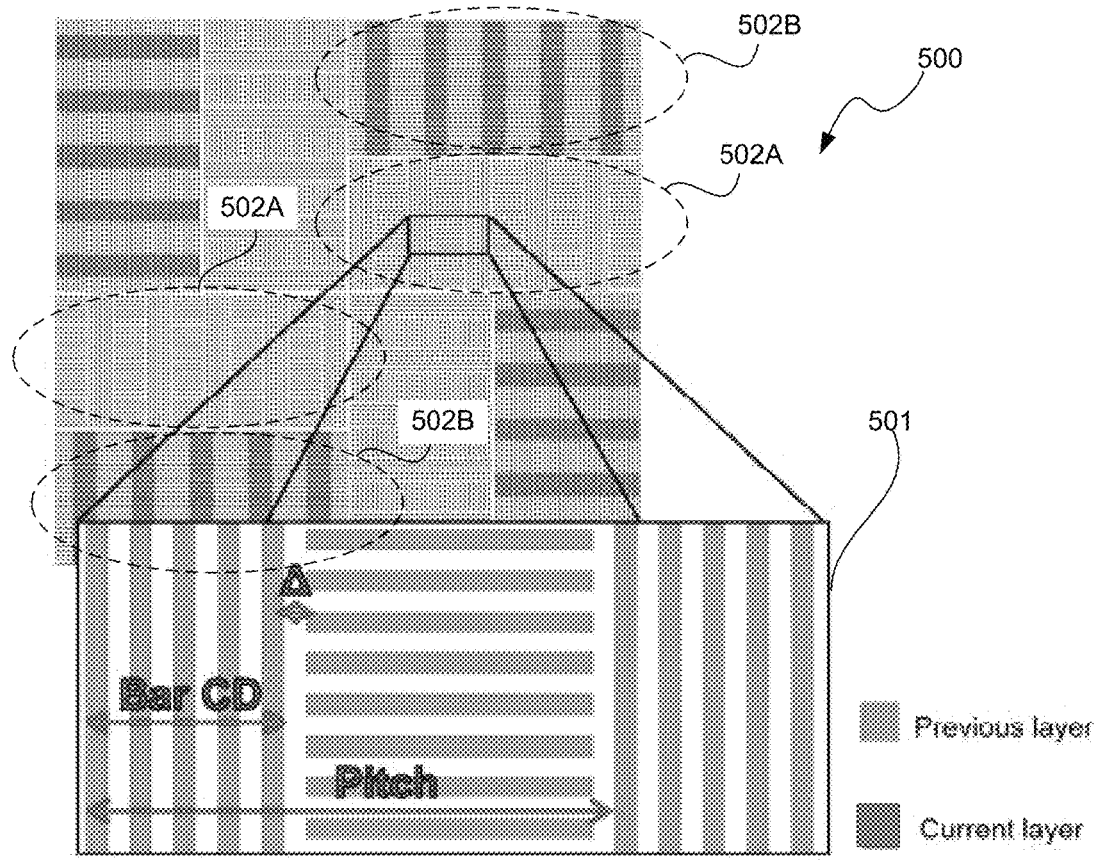
FIG. 5 is a top plan view of an alternative combination XY overlay mark having overlapping periodic line structures for which symmetric beam scan techniques may be implemented in accordance with specific embodiments of the present invention.

FIG. 5 is a top plan view of an alternative combination XY overlay mark 500 having overlapping periodic line structures for which symmetric beam scan techniques may be implemented in accordance with specific embodiments of the present invention. This target 500 includes complex patterns of sub-resolution X and Y features, with some of the X structures interleaved with the Y structures. For example, working group 502A contains interleaved X and Y sub-resolution features for a first layer as shown in expanded area 501. Some of the working zones also include an overlaid working zone for a second layer that is formed after and on top of the first layer. For instance, working zone 502B contains X and Y sub-resolution periodic features in the first layer with a second layer of X course periodic structures formed over the first layer periodic structures. Overlay may generally be determined by the difference between centers of symmetry/gravity of the currently formed layer patterns and previous layer patterns.

Figure 6:
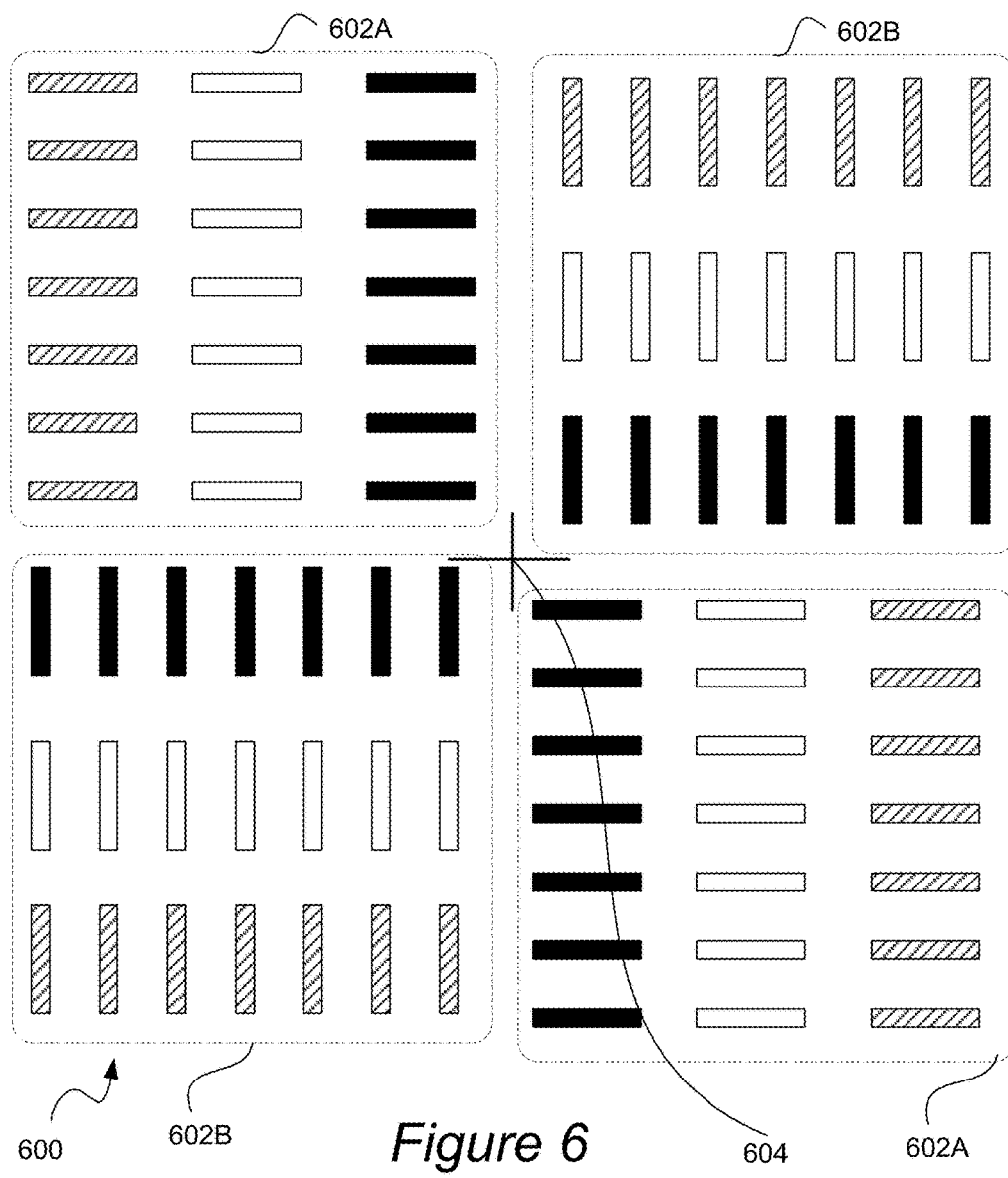
FIG. 6 is another target having XY overlay structures for which symmetric beam scan techniques may be implemented in accordance with specific embodiments of the present invention.

FIG. 6 is another target 600 having XY overlay structures for which symmetric beam scan techniques may be implemented in accordance with specific embodiments of the present invention. As shown, working group 602A contains Y overlay grating structures in three different layers (white, black and cross-hashing), while working group 602B contains X overlay grating structures in the same three different layers (white, black, and cross-hatching). In this example, the structures for each layer in each working group are arranged to have a same center position 604 when there is zero overlay error. Overlay may generally be determined by the difference between centers of gravity (or deviation from predefined offset between centers of gravity) of the currently formed layer patterns and previous layer patterns.

For each of the above-described XY targets, a scan pattern may generally include tilted bidirectional scans with respect to the line edges and symmetrical with respect to the target, with or without skipping lines in between sequential scans. For instance, the beam may be scanned with respect to combination XY target along sets of swaths that are tilted at 45°, 135°, 225°, and 315° or any suitable combination of symmetrical angles that are tilted with respect to the overlay target's orientation. For instance, the tilt angles can include 19° to 21° and 199° to 201° so the e-beam can scan perpendicular to the top layer pattern (e.g., 701) in FIG. 7.

Figure 7:
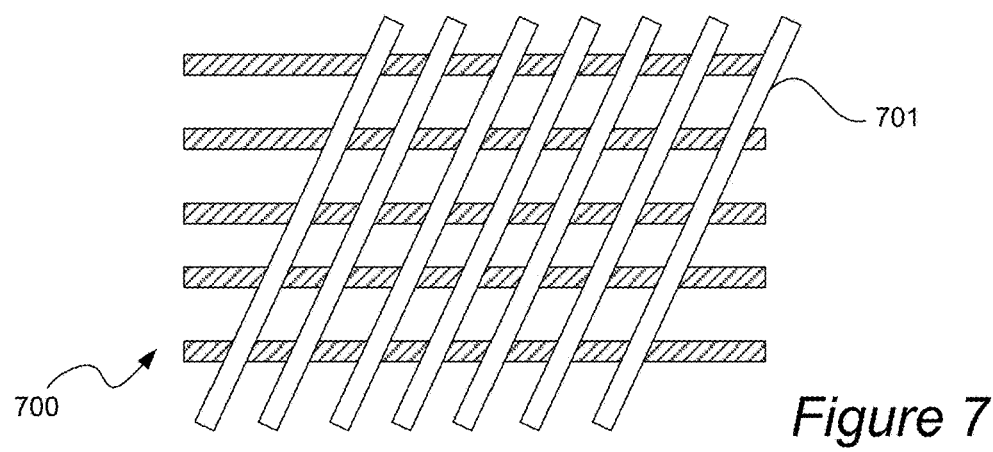
FIG. 7 is a top plan view of an alternative target portion having periodic line structures in different layers and directions that are tilted with respect to each other and for which symmetric beam scan techniques may be implemented in accordance with specific embodiments of the present invention.

The scanning techniques described herein may also be applied to targets having periodic structures that include sub-structures that are tilted in directions with respect to each other, other than perpendicular to each other like the XY combination targets of FIGS. 4A-4I. FIG. 7 is a top plan view of an alternative target portion 700 having periodic line structures in different layers and directions that are tilted with respect to each other at an angle that excludes a perpendicular or parallel angle. That is, the tilt angle between the two gratings is greater than 0° and less than 90°. In this illustration, the target has a set of lines in a first layer, which are denoted by cross-hatched shading, and a set of lines in a second layer, which are denoted by white shading. The second layer lines are tilted with respect to the first layer lines at an angle that is about 21°.

In the example of FIG. 7 as well as other types of targets, the charged particle beam can be scanned in pairs of symmetrical scans at any suitable symmetrical combination of tilted angles. Each pair of scans include two opposite directional set of scans that are symmetrical with respect to each other, and the resulting scan paths of all scan pairs are not parallel to any longitudinal axis of the target. In general, the beam scan pattern may include scans that are either perpendicular to each of the line sets or tilted with respect to each of the line sets. For the target 700 by way of example, the charged particle beam would not be scanned in east and west directions since this would result in the horizontal lines of the second layer being scanned along their longitudinal axis. Overlay for the target of FIG. 7 may generally be determined by the difference between centers of gravity of the currently formed layer patterns and previous layer patterns.

Figure 8:
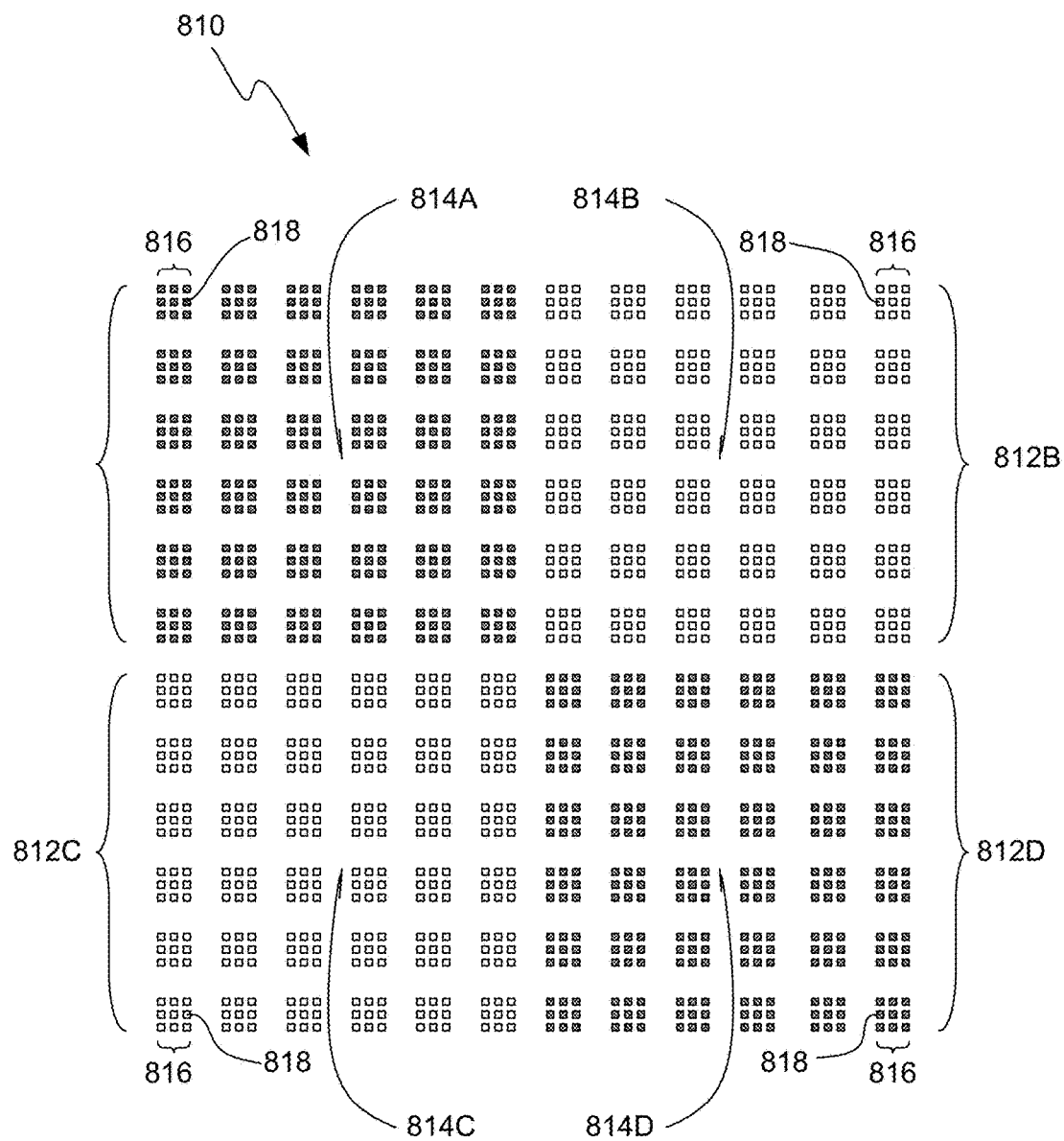
FIG. 8 is a top plan view of an alternative combination XY overlay mark formed from a plurality of contact structures for which symmetric beam scan techniques may be implemented in accordance with specific embodiments of the present invention.

In other embodiments, the target does not include separated X and Y structures, but integrated XY structures. FIG. 8 is a top plan view of an alternative overlay mark 810 formed from a plurality of contact structures for which X and Y overlay may be determined. As shown, the overlay mark 810 is configured to measure overlay in two separate directions. As such, mark 810 obviates the need to have separately positioned or offset structures for each X and Y direction in which overlay is to be measured. Overlay mark 810 is shown in a configuration that results when the tested layers of a wafer are in perfect alignment.

The overlay mark 810 includes a plurality of working zones 812 for determining the registration error between two wafer layers in two different directions. In the illustrated embodiment, the overlay mark 810 includes four square shaped working zones 812, which are configured to substantially fill a field of view (not shown) of the metrology tool used to image the overlay mark 810. The working zones 812 represent the actual areas of the mark that are used to calculate alignment between different layers of the wafer. As mentioned previously, the working zones 812 are spatially separated from one another so that they do not overlap portions of an adjacent working zone of the second layer.

In this example, the working zones are configured to provide overlay information in two directions, as for example, in the X and Y directions. Of the four working zones 812A-D, two of them 812A and 812D are disposed in the first layer and two of them 812B and 812C are disposed in the second layer (the first layer is represented by solid fill, the second layer is represented by no fill). Working zones 812A and 812D, which are disposed on the same first layer, are positioned opposite one another at a first vertical angle while working zones 812B and 812C, which are disposed on the same second layer, are positioned opposite one another at a second vertical angle (e.g., diagonally). These cross-positioned structures form an "X" shaped pattern.

Each of the working zones 812 contains an individual periodic structure 814, as for example, periodic structures 814A-D. As shown, each of the periodic structures 814 substantially fills the perimeter of its corresponding working zone 812. As should be appreciated, each of the periodic structures 814 is formed in the layer of its corresponding working zone 812. The periodic structures 814 include coarsely segmented elements 816 that are arranged in spaced apart rows and columns. Optionally, each of the coarsely segmented elements 816, in turn, may also be formed by finely segmented elements 818. The finely segmented elements 818 are also arranged in spaced apart rows and columns. The individual coarsely segmented elements 816 and finely segmented elements 818 may be configured with a variety of sizes, shapes and distributions. In the illustrated embodiment, both the coarsely segmented elements 816 and finely segmented elements 818 are square shaped and equally spaced from an adjacent element. As should be appreciated, overlay mark 810 can be used to measure the misregistration value in two separate directions that are perpendicular to each other since the mark 810 has the same repeating structural pattern in orthogonal directions.

The overlay contact array target 810 may be scanned in north, south, east, and west directions, only north and south directions (for Y overlay), or only eat and west directions (for X overlay). Any scan pattern may include skipping lines. In another combination example (not illustrated), the target may include an array of cross-shaped structures. In this later example, the beam may be scanned at tilted angles with respect to the target, like the combination XY targets described herein.

Figure 9:
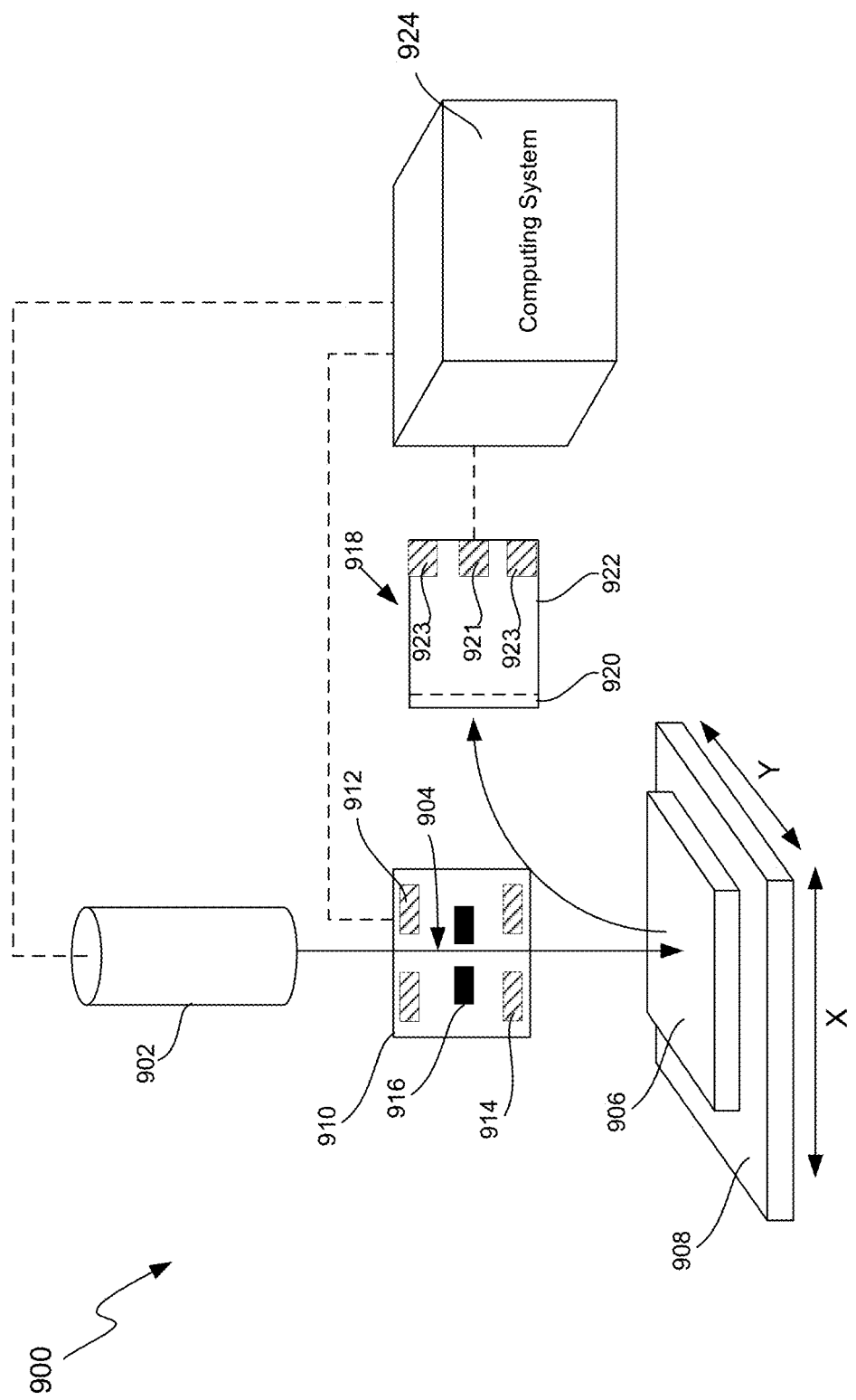
FIG. 9 is a diagrammatic representation of a scanning electron microscopy (SEM) overlay metrology system in accordance with one embodiment of the present invention.

Any suitable combination of hardware and/or software may be used to implement any of the above described techniques. FIG. 9 is a diagrammatic representation of a scanning electron microscopy (SEM) overlay metrology system in accordance with one embodiment of the present invention. Scanning in symmetrical directions across the periodic structures may avoid image asymmetries caused by buildup of electrons, and as a result, minimize inaccurate overlay measurements (or the like).

In some embodiments, the system 900 may include, but is not limited to, a defect-review (DR) SEM tool with SEM overlay option, a critical-dimension (CD) SEM tool with SEM overlay option, a standalone SEM tool, a lithography/etch tool with integrated SEM overlay metrology, or a lithography/etch metrology cluster with features such as imaging optical overlay, scatterometry optical overlay, scatterometry CD, and CDSEM with SEM overlay option. The system 900 may be configured to scan a sample 906 such as, but not limited to, a wafer (e.g., semiconductor wafer) having two or more layers formed thereon with an electron beam 904 in order to determine overlay error (e.g., a misalignment or spatial offset between at least two layers of interest).

The system 900 may operate in any scanning mode known in the art. For example, the system 900 may operate in a swathing mode when scanning an electron beam 904 across the surface of the sample 906. In this regard, the system 900 may scan an electron beam 904 across the sample 906, while the sample is moving, with the direction of scanning being nominally perpendicular to the direction of the sample motion. By way of another example, the system 900 may operate in a step-and-scan mode when scanning an electron beam 904 across the surface of the sample 906. In this regard, the system 900 may scan an electron beam 904 across the sample 906, which is nominally stationary when the beam 904 is being scanned.

The system 900 may include an electron beam source 902 for generating one or more electron beams 904. The electron beam source 902 may include any electron source known in the art. For example, the electron beam source 902 may include, but is not limited to, one or more electron guns. In some embodiments, a computing system 924 or controller may be communicatively coupled to the electron beam source 902. The computing system 924 may be configured to adjust one or more electron source parameters via a control signal to the electron beam source 902. For example, the computing system 924 may be configured to vary the beam current for the electron beam 904 emitted by source 902 via a control signal transmitted to control circuitry of the electron beam source 902.

The sample 906 may be disposed on a sample stage 908 configured to support the sample 906 during scanning. In some embodiments, the sample stage 908 is an actuatable stage. For example, the sample stage 908 may include, but is not limited to, one or more translational stages suitable for selectably translating the sample 906 along one or more linear directions (e.g., x-direction, y-direction and/or z-direction). By way of another example, the sample stage 908 may include, but is not limited to, one or more rotational stages suitable for selectably rotating the sample 906 along a rotational direction. By way of another example, the sample stage 908 may include, but is not limited to, a rotational stage and a translational stage suitable for selectably translating the sample along a linear direction and/or rotating the sample 906 along a rotational direction.

In some embodiments, the computing system 924 or controller is communicatively coupled to the sample stage 908. The computing system 924 may be configured to adjust one or more stage parameters via a control signal transmitted to the sample stage 908. The computing system 924 may be configured to vary the sample scanning speed and/or control the scan direction via a control signal transmitted to control circuitry of the sample stage 908. For example, the computing system 924 may be configured to vary the speed and/or control the direction with which sample 906 is linearly translated (e.g., x-direction or y-direction) relative to the electron beam 904. As discussed in further detail herein, the sample 906 may be scanned in a tilted orientation relative to feature placement (e.g., perpendicular or tilted otherwise with respect to a longitudinal axis of the pattern lines) of target structures forming an overlay metrology target or mark on the sample 906.

The system 900 may further include a set of electron-optic elements 910. The set of electron-optics may include any electron-optic elements known in the art suitable for focusing and/or directing the electron beam 904 onto a selected portion of the sample 906. In one embodiment, the set of electron-optics elements includes one or more electron-optic lenses. For example, the electron-optic lenses may include, but are not limited to, one or more condenser lenses 912 for collecting electrons from the electron beam source. By way of another example, the electron-optic lenses may include, but are not limited to, one or more objective lenses 914 for focusing the electron beam 904 onto a selected region of the sample 906. In some embodiments, the electron beam 904 may be directed to the sample 906 at a controlled angle to the sample grating. Because wafer system of coordinates does not necessarily coincide with SEM system of coordinates, controlling a fine scan angle may improve matching between the coordinate systems and significantly contribute to sampling performance/accuracy.

In some embodiments, the set of electron-optics elements includes one or more electron beam scanning elements 916. For example, the one or more electron beam scanning elements 916 may include, but are not limited to, one or more scanning coils or deflectors suitable for controlling a position of the beam relative to the surface of the sample 906. In this regard, the one or more scanning elements 916 may be utilized to scan the electron beam 904 across the sample 906 in a selected scan direction or pattern. For example, the sample 906 may be scanned in tilted or perpendicular bidirectional scans relative to feature placement (e.g., at bidirectional directions and angled with respect to target lines) of target structures forming an overlay metrology target or mark on the sample 906. The computing system 924 or controller may be communicatively coupled to one or more of the electron-optic elements 910, such as the one or more scanning elements 916. Accordingly, the computing system may be configured to adjust one or more electron-optic parameters and/or control the scan direction via a control signal transmitted to the one or more communicatively coupled electron-optic elements 910.

The system 900 may further include a detector assembly 918 configured to receive electrons 917 from the sample 906. In some embodiments, the detector assembly 918 includes an electron collector 920 (e.g., secondary electron collector). The detector assembly may further include an energy filter based, for example, on retarding field principle. In this regard, the energy filter may be configured to stop low energy secondary electrons while passing high energy secondary electrons (i.e., backscattered electrons). If the energy filter is not activated, all secondary electrons are detected according to collection efficiency of the detection system. By subtracting high energy electron image from overall electron image, low energy secondary electron image can be obtained. The detector assembly 918 may further include a detector 922 (e.g., scintillating element and PMT detector 922) for detecting electrons from the sample surface (e.g., secondary electrons). In some embodiments, the detection system 922 may include several electron detectors, such as, for example, one or more Bright Field (BF) detectors 921 and one or more Dark Field (DF) detectors 923. In some embodiments, there may be from 2 to 8 (or even more) DF detectors 923. The BF detector 921 detects electrons with low (according to wafer normal) emission angles, while DF detectors 923 provide information carried by the electrons with higher emission angles. In some embodiments, the detector 922 of the detector assembly 918 includes a light detector. For example, the anode of a PMT detector of the detector 922 may include a phosphor anode, which is energized by the cascaded electrons of the PMT detector absorbed by the anode and may subsequently emit light. In turn, the light detector may collect light emitted by the phosphor anode in order to image the sample 906. The light detector may include any light detector known in the art, such as, but not limited to, a CCD detector or a CCD-TDI detector. The system 900 may include additional/alternative detector types such as, but not limited to, Everhart-Thornley type detectors. Moreover, the embodiments described herein are applicable to single detector and multiple-detector arrangements.

In some embodiments, the computing system 924 or controller is communicatively coupled to the detector assembly 918. The computing system 924 may be configured to adjust one or more image forming parameters via a control signal transmitted to the detector assembly 918. For example, the computing system may be configured to adjust the extraction voltage or the extraction field strength for the secondary electrons. Those skilled in the art will appreciate that "the computing system 924" may include one or more computing systems or controllers, such as one or more processors configured to execute one or more instruction sets embedded in program instructions stored by at least one non-transitory signal bearing medium. The computing system 924 may control various scanning or sampling parameters such as, but not limited to, those described herein.

While the foregoing description focused on the detector assembly 918 in the context of the collection of secondary electrons, this should not be interpreted as a limitation on the present invention. It is recognized herein that the detector assembly 918 may include any device or combination of devices known in the art for characterizing a sample surface or bulk with an electron beam 904. For example, the detector assembly 918 may include any particle detector known in the art configured to collect backscattered electrons, Auger electrons, transmitted electrons or photons (e.g., x-rays emitted by surface in response to incident electrons). In some embodiments, as discussed above, the detected electrons are differentiated (e.g., secondary electrons vs. backscattered electrons) based upon the energy levels and/or emission angles of the detected electrons, and by subtracting high energy electron image from overall electron image, low energy secondary electron image can be obtained.

The computing system 924 may be configured to receive and/or acquire data or information (e.g., detected signals/images, statistical results, reference or calibration data, training data, models, extracted features or transformation results, transformed datasets, curve fittings, qualitative and quantitative results, etc.) from other systems by a transmission medium that may include wireline and/or wireless portions. In this manner, the transmission medium may serve as a data link between the computing system 924 and other systems (e.g., memory on-board metrology system, external memory, reference measurement source, or other external systems). For example, computing system 924 may be configured to receive measurement data from a storage medium (e.g., internal or external memory) via a data link. For instance, results obtained using the detection system may be stored in a permanent or semipermanent memory device (e.g., internal or external memory). In this regard, the results may be imported from on-board memory or from an external memory system. Moreover, the computing system 924 may send data to other systems via a transmission medium. For instance, qualitative and/or quantitative results, such as overlay values, determined by computing system 924 may be communicated and stored in an external memory. In this regard, measurement results may be exported to another system.

Computing system 924 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. Program instructions may be stored in a computer readable medium (e.g., memory). Exemplary computer-readable media include read-only memory, a random access memory, a magnetic or optical disk, or a magnetic tape.

The metrology tool may be designed to make many different types of measurements related to semiconductor manufacturing. Certain embodiments of the invention for determining quality and/or quantitative values may utilize such measurements. Additional metrology techniques for determining specific target characteristics may also be combined with the above-described quality determination techniques. For example, in certain embodiments the tool may obtain signals/images and determine characteristics of one or more targets (e.g., overlay, critical dimensions, sidewall angles, film thicknesses, process-related parameters (e.g., focus and/or dose). The targets can include certain regions of interest that are periodic in nature, such as for example gratings in a memory die. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools. The data from such measurements may be combined. Data from the metrology tool may be used in the semiconductor manufacturing process, for example, to feed-forward, feed-backward and/or feed-sideways corrections to the process (e.g. lithography, etch) and therefore, might yield a complete process control solution.

Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA, programmable optics components, etc.

Certain embodiments of the present invention presented here generally address the field of semiconductor metrology and process control, and are not limited to the hardware, algorithm/software implementations and architectures, and use cases summarized above.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method of performing overlay metrology upon a target having at least two layers formed thereon, the method comprising:
   providing a target having a plurality of periodic structures for measuring overlay in at least two overlay directions;
   scanning a charged particle beam in a first direction across a plurality of scan swaths of the target and at a first tilt with respect to the target so that each edge of the periodic structures is scanned at an angle;
   scanning the charged particle beam in a second direction, which is opposite the first direction, across the plurality of scan swaths and at a second tilt that is 180° from the first tilt;
   repeating the first and second direction scanning operations for different first and second tilts and a different plurality of scan swaths of the target so that the target is scanned symmetrically;
   combining images that are generated by the first and second direction scanning operations to form a combined image; and
   determining and reporting an overlay error of the target based on analyzing the combined image.

2. The method of claim 1, wherein charging effects on the periodic structures caused by the second direction scanning operation are symmetric with respect to charging effects caused by the first direction scanning operation.

3. The method of claim 1, wherein the target includes periodic structures for both X and Y overlay and wherein repeating the first and second direction scanning operations results in the target being scanned at angles of 45°, 135°, 225°, and 315°.

4. The method of claim 3, wherein the angles of 45°, 135°, 225°, and 315° are achieved by scanning the charged particle beam in both the first and second directions and rotating and translating the target to be scanned in a raster pattern.

5. The method of claim 3, wherein the angles of 45°, 135°, 225°, and 315° are achieved by scanning the charged particle beam in a single translational direction and rotating the target to each of the angles 45°, 135°, 225°, and 315°.

6. The method of claim 1, wherein the combined image has symmetrical charging effects due to the first and second direction scanning operations.

7. The method of claim 1, wherein the first and second scanning operations include skipping a plurality of skipped lines of the periodic structures between each sequential pair of scan swaths, wherein the combined image excludes image portions for such skipped lines, wherein the skipped lines have a count of 8 or more.

8. The method of claim 7, wherein the skipped lines have a count of 100 or more.

9. The method of claim 1, wherein the periodic structures include X and Y line gratings, and the scan swaths are kept from being parallel to any longitudinal axis of such X and Y line gratings.

10. The method of claim 1, wherein the periodic structures include a first line grating having a longitudinal axis in a first direction and a second grating in a second direction that differs, and is not perpendicular, to the first direction, and the scan swaths are kept from being parallel to any longitudinal axis of such first and second line gratings.

11. A charged particle beam system for performing overlay metrology upon a target having at least two layers formed thereon, comprising:
    a beam source for generating a charged particle beam;
    optics for directing and scanning the particle beam onto a target having a plurality of periodic structures for measuring overlay in at least two overlay directions;

a stage for holding and moving the target positioned thereon with respect to the charged particle beam;

a detector assembly for receiving signals from the target in response to scanning of the charged particle beam across the target; and a controller configured for performing the following operations in coordination with the beam source, optics, stage, and detector assembly:

scanning a charged particle beam in a first direction across a plurality of scan swaths of the target and at a first tilt with respect to the target so that each edge of the periodic structures is scanned at an angle;

scanning the charged particle beam in a second direction, which is opposite the first direction, across the plurality of scan swaths and at a second tilt that is 180° from the first tilt;

repeating the first and second direction scanning operations for different first and second tilts and a different plurality of scan swaths of the target so that the target is scanned symmetrically;

combining images that are generated by the first and second direction scanning operations to form a combined image; and determining and reporting an overlay error of the target based on analyzing the combined image.

12. The system of claim 11, wherein charging effects on the periodic structures caused by the second direction scanning operation are symmetric with respect to charging effects caused by the first direction scanning operation.

13. The system of claim 11, wherein the target includes periodic structures for both X and Y overlay and wherein repeating the first and second direction scanning operations results in the target being scanned at angles of 45°, 135°, 225°, and 315°.

14. The system of claim 13, wherein the angles of 45°, 135°, 225°, and 315° are achieved by scanning the charged particle beam in both the first and second directions and rotating and translating the target to be scanned in a raster pattern.

15. The system of claim 13, wherein the angles of 45°, 135°, 225°, and 315° are achieved by scanning the charged particle beam in a single translational direction and rotating the target to each of the angles 45°, 135°, 225°, and 315°.

16. The system of claim 11, wherein the combined image has symmetrical charging effects due to the first and second direction scanning operations.

17. The system of claim 11, wherein the first and second scanning operations include skipping a plurality of skipped lines of the periodic structures between each sequential pair of scan swaths, wherein the combined image excludes image portions for such skipped lines, wherein the skipped lines have a count of 8 or more.

18. The system of claim 17, wherein the skipped lines have a count of 100 or more.

19. The system of claim 11, wherein the periodic structures include X and Y line gratings, and the scan swaths are kept from being parallel to any longitudinal axis of such X and Y line gratings.

20. The system of claim 11, wherein the periodic structures include a first line grating having a longitudinal axis in a first direction and a second grating in a second direction that differs, and is not perpendicular, to the first direction, and the scan swaths are kept from being parallel to any longitudinal axis of such first and second line gratings.

* * * * *